US009995470B2

(12) United States Patent
Matsuda

(10) Patent No.: US 9,995,470 B2
(45) Date of Patent: Jun. 12, 2018

(54) ATTACHMENT STRUCTURE FOR LIGHT-EMITTING PANELS, ALIGNED-ARRANGEMENT STRUCTURE FOR LIGHT-EMITTING PANELS, AND LIGHT-EMITTING PANEL

(71) Applicant: KANEKA CORPORATION, Osaka-shi, Osaka (JP)

(72) Inventor: Kuniharu Matsuda, Tokyo (JP)

(73) Assignee: Kaneka Corporation, Osaka-shi, Osaka (JP)

(*) Notice: Subject to any disclaimer, the term of this patent is extended or adjusted under 35 U.S.C. 154(b) by 204 days.

(21) Appl. No.: 15/107,249

(22) PCT Filed: Dec. 9, 2014

(86) PCT No.: PCT/JP2014/082530
§ 371 (c)(1),
(2) Date: Jun. 22, 2016

(87) PCT Pub. No.: WO2015/098497
PCT Pub. Date: Jul. 2, 2015

(65) Prior Publication Data

US 2017/0038044 A1 Feb. 9, 2017

(30) Foreign Application Priority Data

Dec. 27, 2013 (JP) ................................ 2013-273274
Jan. 20, 2014 (JP) ................................ 2014-007751

(51) Int. Cl.
*F21V 21/29* (2006.01)
*F21S 8/06* (2006.01)
(Continued)

(52) U.S. Cl.
CPC ................ *F21V 21/29* (2013.01); *F21S 8/04* (2013.01); *F21S 8/061* (2013.01); *F21V 3/02* (2013.01);
(Continued)

(58) Field of Classification Search
CPC .... F21S 8/04; F21S 8/061; F21V 3/02; F21V 15/01; F21V 17/162; F21V 21/29;
(Continued)

(56) References Cited

U.S. PATENT DOCUMENTS 9,615,409 B2 * 4/2017 Matsuda ............. H01L 27/3293
9,723,658 B2 * 8/2017 Matsuda ................ H05B 33/08
(Continued)

FOREIGN PATENT DOCUMENTS

CN 203115677 U 8/2013
JP 2004055160 A 2/2004
(Continued)

OTHER PUBLICATIONS

ISA Japanese Patent Office, International Search Report Issued in Application No. PCT/JP2014/082530, dated Jan. 27, 2015, WIPO, 4 pages.
(Continued)

*Primary Examiner* — Stephen F Husar
(74) *Attorney, Agent, or Firm* — Alleman Hall Creasman & Tuttle LLP

(57) ABSTRACT

The present invention provides a light-emitting panel attachment structure, a light-emitting panel aligned-arrangement structure, and a light-emitting panel that enable light-emitting panels to be arranged with no gap therebetween on an installation surface such as a ceiling. An attachment side fitting part is turnably attached to a coupling part. An attachment device is changeable between a parallel orientation in which the light-emitting panel is parallel to the
(Continued)

BASIC ORIENTATION

EXTENDING ORIENTATION installation surface and an intersecting orientation in which the light-emitting panel faces a direction intersecting the installation surface, along with the turn of the attachment side fitting part. When the light-emitting panel is attached to the attachment device, the attachment device is changed to or maintained in the intersecting orientation, and either the light-emitting panel or the attachment device is moved to slide parallel to an emission surface to fit a panel side fitting part with the attachment side fitting part.

15 Claims, 25 Drawing Sheets

(51) Int. Cl.

| | |
|---|---|
| ***F21V 21/30*** | (2006.01) |
| ***F21V 23/06*** | (2006.01) |
| ***F21S 8/04*** | (2006.01) |
| ***F21V 3/02*** | (2006.01) |
| ***F21V 15/01*** | (2006.01) |
| ***F21V 17/16*** | (2006.01) |
| *F21Y 105/00* | (2016.01) |
| *F21Y 115/15* | (2016.01) |
| *F21Y 115/20* | (2016.01) |

(52) U.S. Cl.
CPC ............ *F21V 15/01* (2013.01); *F21V 17/162* (2013.01); *F21V 21/30* (2013.01); *F21V 23/06* (2013.01); *F21Y 2105/00* (2013.01); *F21Y 2115/15* (2016.08); *F21Y 2115/20* (2016.08); *H01L 2251/5361* (2013.01)

(58) Field of Classification Search
CPC ...... F21V 21/30; F21V 23/06; F21Y 2105/00; F21Y 2115/15; F21Y 2115/20; H01L 2251/5361
See application file for complete search history.

(56) References Cited

U.S. PATENT DOCUMENTS

| | | | |
|---|---|---|---|
| 2012/0287671 A1 | 11/2012 | Parker et al. | |
| 2013/0279181 A1 | 10/2013 | Kawachi et al. | |
| 2014/0347857 A1* | 11/2014 | Wakahara | F21V 19/02 362/249.11 |

FOREIGN PATENT DOCUMENTS

| | | |
|---|---|---|
| JP | 2004265619 A | 9/2004 |
| JP | 2006236877 A | 9/2006 |
| JP | 2007250303 A | 9/2007 |
| JP | 2012129099 A | 7/2012 |
| JP | 2012174504 A | 9/2012 |
| WO | 2004071143 A1 | 8/2004 |
| WO | 2012079603 A1 | 6/2012 |
| WO | 2012157104 A1 | 11/2012 |
| WO | 2013038947 A1 | 3/2013 |

OTHER PUBLICATIONS

International Bureau of WIPO, International Preliminary Report on Patentability Issued in Application No. PCT/JP2014/082530, dated Jul. 7, 2016, WIPO, 6 pages.

European Patent Office, Supplementary European Search Report Issued in European Application No. 14875683, dated Jul. 10, 2017, Netherlands, 2 pages.

* cited by examiner

A-A CROSS SECTION

B-B CROSS SECTION

C-C CROSS SECTION

PARALLEL ORIENTATION

INTERSECTING ORIENTATION

BASIC ORIENTATION

EXTENDING ORIENTATION

PARALLEL ORIENTATION

INTERSECTING ORIENTATION

PARALLEL ORIENTATION

VERTICAL ORIENTATION (INTERSECTING ORIENTATION)

BASIC ORIENTATION

EXTENDING ORIENTATION

ATTACHMENT STRUCTURE FOR LIGHT-EMITTING PANELS, ALIGNED-ARRANGEMENT STRUCTURE FOR LIGHT-EMITTING PANELS, AND LIGHT-EMITTING PANEL

TECHNICAL FIELD

The present invention relates to an attachment structure for a light-emitting panel. In particular, the present invention relates to an attachment structure for an organic EL panel for lighting. The present invention also relates to a light-emitting panel aligned-arrangement structure using the light-emitting panel attachment structure.

The present invention relates to a light-emitting panel for lighting that is provided with an emission surface including a planar emission region on at least one principal surface thereof. In particular, the present invention relates to a light-emitting panel that can be easily attached to and detached from an installation surface and an attachment structure for the light-emitting panel.

BACKGROUND ART

Recently, an organic EL panel has received attention as a lighting apparatus that takes the place of an incandescent lamp and a fluorescent lamp.

The organic EL panel generally includes a base material such as a glass substrate and an organic EL element laminated on the base material, and has a structure for sealing the organic EL element and a structure for supplying power to the organic EL element.

The organic EL element includes two electrodes, one or both of which have translucency and which face each other and a light-emitting layer which is made of an organic compound and laminated between the two electrodes. The organic EL panel emits light by energy of recombination between an electrically excited electron and a positive hole.

The organic EL panel used as a lighting apparatus is a planar light source and placed on an installation surface such as a ceiling or a wall similarly to a common lighting apparatus. Thus, the organic EL panel is often fixed and used in an orientation parallel to the installation surface such as a ceiling or a wall.

Patent Document 1 discloses an example of a structure that fixes a lighting panel to an installation surface such as a ceiling or a wall. The lighting apparatus of Patent Document 1 is provided with a body which is fixed to the installation surface, an attachment cover having a housing shape, a support tool, a lighting panel, and a holding member. The attachment cover is turnably supported by the support tool. In the lighting apparatus of Patent Document 1, when the lighting panel is attached, the lighting panel is housed in and temporarily fixed to the attachment cover, and the attachment cover with the lighting panel temporarily fixed is turned to bring the lighting panel into an orientation parallel to the installation surface. In the lighting apparatus of Patent Document 1, the attachment cover is fixed in a parallel orientation by the holding member.

PRIOR ART DOCUMENTS

Patent Documents

Patent Document 1: JP 2012-174504 A
Patent Document 2: WO 2013/038947 A

DISCLOSURE OF INVENTION

Technical Problem

As described above, an organic EL panel is a planar light source. Thus, when an installation area of the organic EL panel is increased, a light-emitting area increases corresponding to the increase in the installation area. Thus, organic EL panels may be densely laid on the installation surface such as a ceiling or a wall in a living space (Patent Document 2, for example). Accordingly, the entire area of the installation surface such as a ceiling or a wall seems to emit light, which improves the interior property.

However, in the lighting apparatus described in Patent Document 1, the support tool and the holding member are located at positions facing each other across the body. That is, when the lighting apparatus described in Patent Document 1 is assembled, the support tool and the holding member project from the lighting panel on both sides thereof. Thus, when the lighting apparatuses described in Patent Document 1 are laid in a planar state, a gap is formed between adjacent lighting apparatuses. Thus, the lighting panels look like being intermittently arranged, which disadvantageously deteriorates the integrity of lighting as a whole.

In view of the above, it is an object of the present invention to provide a light-emitting panel attachment structure capable of attaching light-emitting panels with no gap therebetween to an installation surface such as a ceiling. Further, it is another object of the present invention to provide a light-emitting panel aligned-arrangement structure that uses the light-emitting panel attachment structure.

It is still another object of the present invention to provide a light-emitting panel that enables light-emitting panel attachment with no gap to an installation surface such as a ceiling and that can be easily attached to and detached from the installation surface.

Solution to Problem

One aspect of the present invention for solving the above problem is a light-emitting panel attachment structure including a light-emitting panel having an emission surface on one principal surface and an attachment device capable of attaching the light-emitting panel to an installation surface, the light-emitting panel including a panel side fitting part on the other principal surface, the attachment device including an attachment side fitting part fittable with the panel side fitting part and a coupling part located closer to the installation surface side than the attachment side fitting part, wherein the attachment side fitting part is turnably attached to the coupling part, wherein an orientation of the attachment device is changeable at least between a parallel orientation in which the attached light-emitting panel is parallel to the installation surface and an intersecting orientation in which the light-emitting panel faces a direction intersecting the installation surface along with a turn, and wherein when the light-emitting panel is attached to the attachment device, the attachment device is changed to or maintained in the intersecting orientation, and either the light-emitting panel or the attachment device is slid parallelly to the emission surface to fit the panel side fitting part and the attachment side fitting part with each other.

The "installation surface" described herein is a wall surface to be an attachment target of the light-emitting panel, for example, a ceiling, a wall, or a floor surface.

In the light-emitting panel attachment structure of this aspect, the attachment device includes the attachment side fitting part turnably attached to the coupling part, and the light-emitting panel includes the panel side fitting part on the face opposite to the emission surface. That is, the light-emitting panel attachment structure of this aspect includes the fitting parts in both of the attachment device and the light-emitting panel, and the fitting parts are fitted with each other to integrate the attachment device and the light-emitting panel together at the side opposite to the emission surface, so that the light-emitting panel is attached to the installation surface.

Thus, when the light-emitting panel is attached to the installation surface, the fitting part of the attachment device and the fitting part of the light-emitting panel are covered with the light-emitting panel when viewed from a living space. Thus, the fitting parts are substantially or completely not visually recognized from a user. That is, a user does not have a feeling of strangeness to the existence of the fitting parts, which results in good appearance.

According to this aspect, in the attachment device, the attachment side fitting part is turnable with respect to the coupling part. The turn of the attachment side fitting part switches the attachment device between the parallel orientation in which the light-emitting panel as an attachment target is parallel to the installation surface and the intersecting orientation in which the light-emitting panel faces the direction intersecting the installation surface.

That is, in the light-emitting panel attachment structure of this aspect, a turning center is present between the coupling part and the attachment side fitting part, and a part fitted with the panel side fitting part of the light-emitting panel and a part that serves as the turning center differ from each other. Thus, the light-emitting panel attachment structure of this aspect enables a turning operation and a fitting operation to be independently performed.

The light-emitting panel attachment structure of this aspect enables a living space side to be illuminated from the emission surface similarly to a common lighting by bringing the attachment device into the parallel orientation. Thus, it is possible to sufficiently exhibit a lighting function of the light-emitting panel.

In the light-emitting panel attachment structure of this aspect, the attachment side fitting part fittable with the panel side fitting part of the light-emitting panel faces the direction intersecting the installation surface by bringing the attachment device into the intersecting orientation. Thus, the light-emitting panel and the attachment device can be easily fitted with each other by sliding either the light-emitting panel or the attachment device in the intersecting direction.

In this aspect, either the light-emitting panel or the attachment device is slid parallelly to the emission surface to fit the panel side fitting part and the attachment side fitting part with each other. For example, the installation surface may be a ceiling. Even in this case, when the light-emitting panel is returned to the parallel orientation to be used as lighting, the panel side fitting part and the attachment side fitting part are fitted with each other in a direction perpendicular to the vertical direction. Thus, the light-emitting panel is less prone to fall due to its own weight. Further, it is possible to attach and detach the light-emitting panel to and from the attachment device without pressing of the emission surface by the attachment device.

In the above aspect, the attachment device may be capable of supporting the light-emitting panel in both of the parallel orientation and the intersecting orientation.

According to this aspect, the light-emitting panel can be supported in both of the parallel orientation and the intersecting orientation. Thus, for example, even when the installation surface is a ceiling, the light-emitting panel does not fall in the intersecting orientation. Thus, the light-emitting panel can function as lighting also in the intersecting orientation in addition to the parallel orientation. Thus, it is possible to change the orientation of the light-emitting panel according to a change in the interior.

In a preferred aspect, a turning center of the attachment side fitting part is located near an end of the light-emitting panel in the parallel orientation in plan view of the light-emitting panel.

The "position near the end of the light-emitting panel" described herein indicates a range of a distance within 5 cm from the end of the light-emitting panel.

According to this aspect, the turning center of the attachment side fitting part is located near the end, that is, located at a position away from the center in the parallel orientation. Thus, even when the turning angle in the change from the parallel orientation to the intersecting orientation is small, it is possible to easily move either the light-emitting panel or the attachment device to slide to fit the panel side fitting part and the attachment side fitting part with each other.

In the above aspect, the distance between the turning center of the attachment side fitting part and the end of the light-emitting panel may fall within the range of one-tenth of the length of the long side of the light-emitting panel in the parallel orientation in plan view of the light-emitting panel.

In order to allow the light-emitting panel to emit light, it is necessary to supply power to the light-emitting panel. For example, Patent Document 2 discloses an example of a structure that supplies power to the light-emitting panel.

Patent Document 2 discloses a lighting apparatus provided with a power supply structure that supplies power to a lighting panel from a holding member fixed to, for example, a ceiling through an attachment tool.

In the lighting apparatus of Patent Document 2, the attachment tool is attached to cover the outer periphery of the cylindrical holding member, and the lighting panel is turnably supported around the holding member as a turning axis.

However, since the holding member of Patent Document 2 has both a function as the turning axis during the turn of the lighting panel and a function of power supply to the lighting panel at the same time, when the lighting panel is turned, an electrical contact between the holding member and the attachment tool is changed by the orientation of the lighting panel, which changes a resistance value between the holding member and the attachment tool. Thus, power supply cannot be stably performed with the structure described in Patent Document 2. Further, in the structure described in Patent Document 2, when the lighting panel is replaced, the holding member connected to an external power source is exposed. Thus, a user may touch the holding member, which causes a problem in view of safety of a user.

In view of this, in a preferred aspect, the attachment side fitting part is electrically connected to an external power source, and fitting between the panel side fitting part and the attachment side fitting part enables power supply to the light-emitting panel.

According to this aspect, power can be supplied to the light-emitting panel by fitting the attachment side fitting part electrically connected to an external power source with the panel side fitting part. Thus, it is not necessary to independently provide wiring for power supply.

As described above, in this aspect, the orientation change of the light-emitting panel is performed by the relationship between the attachment side fitting part and the coupling part, and the power supply is performed by the relationship between the panel side fitting part and the attachment side fitting part. That is, in this aspect, a part that has a function of changing the orientation of the light-emitting panel and a part that has a function of supplying power to the light-emitting panel differ from each other differently from Patent Document 2. Thus, according this aspect, power can be stably supplied to the light-emitting panel by changing the orientation of the light-emitting panel without a change in the resistance value.

In a more preferred aspect, the light-emitting panel includes a light-emitting element, the attachment side fitting part includes an attachment side power supply terminal electrically connected to the external power source, the panel side fitting part includes a panel side power supply terminal for supplying power to the light-emitting element, and when the light-emitting panel is attached to the attachment device, the attachment side power supply terminal and the panel side power supply terminal are relatively slid so as to make contact with each other.

According to this aspect, when the light-emitting panel is attached to the attachment device, the attachment side power supply terminal and the panel side power supply terminal are relatively slid so as to come into contact with each other. Thus, it is possible to reduce the contact resistance between the attachment side power supply terminal and the panel side power supply terminal. Thus, according to this aspect, electrical conductivity between the attachment side power supply terminal and the panel side power supply terminal can be sufficiently ensured, which enables the resistance loss to be reduced.

In a preferred aspect, the attachment side fitting part is connected to the coupling part through a universal joint.

The "universal joint" described herein indicates a joint that freely changes an angle between two joined materials, and is a superordinate concept of a ball bearing.

According to this aspect, since the attachment side fitting part and the coupling part are connected through the universal joint, the turning angle is large, and the fixation can be performed in various orientations other than the parallel orientation in accordance with the interior. Thus, according to this aspect, the light-emitting panel attachment structure has high decorativeness.

In a preferred aspect, the attachment device is capable of arranging the attachment side fitting part at a position farther from the installation surface in a vertical direction when configured in the intersecting orientation than when configured in the parallel orientation.

According to this aspect, the attachment side fitting part can be arranged at a position farther from the installation surface in the vertical direction than a position in the parallel orientation. Thus, even when a plurality of light-emitting panels are laid on the installation surface, and other light-emitting panels are placed around the light-emitting panel of this aspect, it is possible to fit the attachment side fitting part and the panel side fitting part with each other at a position more away from the installation surface than the other light-emitting panels. Thus, according to this aspect, the other light-emitting panels do not become obstacles during fitting.

Further, according to this aspect, it is not necessary to form a space for an attachment operation between the light-emitting panel and the other light-emitting panels, and it is possible to densely arrange a plurality of light-emitting panels in the plane direction of the emission surfaces.

In a preferred aspect, the attachment device includes a fixing part fixed to the installation surface and an extensible part capable of extension and contraction, the extensible part being interposed between the fixing part and the attachment side fitting part, and the attachment device is extensible so that the attachment side fitting part is located at a position farther from the installation surface in the vertical direction when configured in the intersecting orientation than when configured in the parallel orientation.

According to this aspect, the attachment side fitting part is located at a position farther from the installation surface in the vertical direction than a position in the parallel orientation due to an extensible function of the extensible part. Thus, the extensible part itself is less prone to become an obstacle for installation.

In the above aspect, the light-emitting panel may include a built-in organic EL element provided with a laminated structure including an organic light-emitting layer interposed at least between a first electrode layer and a second electrode layer.

According to this aspect, since the light-emitting panel is the organic EL panel including the organic EL element, the light-emitting panel is thin and light, and less prone to fall by its own weight. Thus, the light-emitting panel attachment structure has high safety and high reliability.

In a preferred aspect, the light-emitting panel attachment structure includes a plurality of the light-emitting panels arranged with planar expansion, the attachment device includes a plurality of the attachment side fitting parts that are arranged corresponding to the light-emitting panels, and turning centers of the attachment side fitting parts are arranged side by side at an interval of a length in a fitting direction of the light-emitting panel.

According to this aspect, since the light-emitting panels are arranged with planar expansion, and the turning centers of the attachment side fitting parts are arranged side by side at an interval of the length in the fitting direction of the light-emitting panel, it is possible to arrange the light-emitting panels with substantially no gap formed therebetween.

The state having "substantially no gap between the light-emitting panels" described herein allows a gap of a few millimeters or less into which a finger or a device cannot be inserted.

One aspect of the present invention is a light-emitting panel aligned-arrangement structure including a plurality of the light-emitting panel attachment structures according to the above aspect, wherein the light-emitting panel attachment structures are arranged with planar expansion, and wherein turning centers of the attachment side fitting parts are arranged side by side at an interval of a length in a fitting direction of the light-emitting panel.

According to this aspect, since the light-emitting panels are arranged with planar expansion, and the turning centers of the attachment side fitting parts are arranged side by side at an interval of the length in the fitting direction of the light-emitting panel, it is possible to arrange the light-emitting panels with substantially no gap formed between the light-emitting panels.

One aspect of the present invention is a light-emitting panel attachable to an attachment device having an attachment side fitting part, the light-emitting panel including a panel body having an emission surface on one principal surface, and a frame member including a back face side cover part covering at least a part of a peripheral part of the other principal surface of the panel body and a panel side fitting part on a face opposite to the panel body, the panel side fitting part including an extending part that extends from the back face side cover part toward a center of the panel body in plan view, a standing wall part that stands from an extending direction end of the extending part, and an overhanging part that overhangs from a tip of the standing wall part in an overhanging direction parallel to the extending direction of the extending part, wherein the panel side fitting part is slid in the overhanging direction of the overhanging part to fit the panel side fitting part to the attachment side fitting part to form a fitting state when the light-emitting panel is attached to the attachment device, and wherein the panel side fitting part is once slid in the overhanging direction and then slid in a direction opposite to the overhanging direction to release the fitting state when the light-emitting panel is detached from the attachment device.

The above aspect may be a light-emitting panel including an emission surface on one principal surface and a frame member covering, as a back face side cover part, at least a part of a peripheral part of the other principal surface, wherein the frame member includes a panel side fitting part for attaching the light-emitting panel to an installation surface on the other principal surface, the panel side fitting part includes an extending part extending from the back face side cover part toward a center of the other principal surface, a standing wall part standing from an extending direction end of the extending part, and an overhanging part overhanging from a tip of the standing wall part in an overhanging direction parallel to the extending direction, when the light-emitting panel is attached to the installation surface, the attachment can be performed by sliding the light-emitting panel in the overhanging direction parallel to the emission surface, and when the light-emitting panel is detached from the installation surface, the detachment can be performed by once sliding the light-emitting panel in the overhanging direction and then sliding the light-emitting panel in a direction opposite to the overhanging direction.

The "peripheral part" described herein indicates a region around the center and located away from the center by a predetermined distance.

With the light-emitting panel of these aspects, the light-emitting panels can be attached with no gap therebetween to the installation surface, and the attachment/detachment (hereinbelow, also referred to as "panel detachment/attachment") to/from the installation surface can be easily performed.

For example, even with a light-emitting panel that is characterized in its thinness and lightness and includes a planar light source such as an organic EL panel, the panel detachment/attachment can be performed while directly applying a force only to the frame member thereof without directly applying a force to the planar light source itself, in particular, to the normal line direction of the plane of the planar light source. Thus, it is possible to prevent occurrence of damage of the planar light source.

That is, according to this aspect, since the panel detachment/attachment can be performed by sliding the panel side fitting part of the frame member in the overhanging direction of the overhanging part extending in the plane direction of the light-emitting panel, it is possible to attach the light-emitting panel without transmitting an external force in the perpendicular direction to the emission surface of the light-emitting panel. Further, the reaction force applied to the panel side fitting part during fitting escapes from the overhanging part to the back face side cover part through the standing wall part and the extending part and is basically absorbed by the frame member. Thus, the reaction force is not transmitted to the most part of the light-emitting panel. Thus, for example, even in a light-emitting panel that is thin and may be bent such as an organic EL panel, damage caused by the reaction force from the attachment device during the panel detachment/attachment can be prevented.

In the above aspect, in the fitting state, movement in the direction opposite to the overhanging direction of the panel side fitting part may be restricted by the attachment side fitting part.

According to this aspect, since the movement in the opposite direction of the panel side fitting part is restricted in the fitting state, the light-emitting panel is less prone to carelessly come off the attachment device.

In a preferred aspect, the overhanging direction of the overhanging part is opposite to the extending direction of the extending part.

According to this aspect, the reaction force received from the installation surface during the panel detachment/attachment is mainly applied in a direction toward the inner side of the frame member and the light-emitting panel. Thus, the integration strength between the frame member and the light-emitting panel increases, and the panel detachment/attachment having physically high strength and high reliability can be performed.

In a preferred aspect, the panel body includes an organic EL panel having the emission surface, the frame member includes a casing part that has the back face side cover part and that reaches one end side of the panel body in plan view of the panel body, and the light-emitting panel includes a reinforcement member, the reinforcement member being in contact with the casing part and the extending direction end of the extending part, the reinforcement member being in contact with the panel body.

In the above aspect, the light-emitting panel may include an organic EL panel having the emission surface, the frame member may include the back face side cover part and a casing part reaching at least one end side of the organic EL panel, and the light-emitting panel may include a reinforcement member disposed between the casing part and an extending direction end of the extending part in contact with the casing part and the extending direction end of the extending part or in contact with the organic EL panel.

According to these aspects, since the reaction force can be absorbed by the reinforcement member, a higher strength can be achieved. That is, even when a load is applied to the light-emitting panel due to the reaction force, the stiffness against the load can be maintained by the reinforcement member. Thus, the light-emitting panel is less prone to be damaged. That is, according to these aspects, the light-emitting panel has high strength due to the stiffness reinforced by the reinforcement member.

In a preferred aspect, the light-emitting panel is attachable to the attachment device having an attachment side power supply terminal electrically connected to an external power source, wherein the panel body includes an organic EL panel having the emission surface, the organic EL panel comprising an organic EL element of a laminated structure where an organic light-emitting layer is interposed at least between a first electrode layer and a second electrode layer, wherein the panel side fitting part comprises a panel side power supply terminal for supplying power to the organic EL element, and wherein when the light-emitting panel is attached to the attachment device, the panel side fitting part is slid in the overhanging direction to slide the panel side power supply terminal relative to the attachment side power supply terminal so as to come into contact with and to be electrically connected to each other.

In this aspect, the organic EL panel may include an organic EL element having a laminated structure, the laminated structure including an organic light-emitting layer interposed at least between a first electrode layer and a second electrode layer, the panel side fitting part may include a panel side power supply terminal for supplying power to the organic EL element, and when the light-emitting panel is attached, an attachment side power supply terminal located on the installation surface and electrically connected to an external power source, and the panel side fitting terminal may be slid in the overhanging direction to relatively slide the attachment side power supply terminal and the panel side power supply terminal so as to come into contact with and to be electrically connected to each other.

According to these aspects, when the light-emitting panel is attached to the attachment device, the attachment side power supply terminal and the panel side power supply terminal are relatively slid so as to come into contact with each other. Thus, it is possible to reduce the contact resistance between the attachment side power supply terminal and the panel side power supply terminal. Thus, according to these aspects, electrical conductivity between the attachment side power supply terminal and the panel side power supply terminal can be sufficiently ensured, which enables the resistance loss to be reduced.

In a preferred aspect, the overhanging part includes at least one engagement piece, a part of an edge of the engagement piece including in plan view a straight line segment linearly extending from an overhanging direction tip of the overhanging part toward the standing wall part, and an uneven segment extending from the overhanging direction tip of the overhanging part toward the standing wall part through a recess and projection.

In this aspect, the overhanging part may include an engagement piece interposed between a segment that extends from the overhanging direction tip toward the standing wall part in plan view and an uneven segment that extends from the overhanging direction tip toward the standing wall part and includes a recess and a projection formed by end faces of a locking piece and a fixing cut-away part.

According to these aspects, the light-emitting panel is provided with the panel side fitting part that can accept a so-called push-push type eject mechanism capable of "once moving the light-emitting panel to slide in the overhanging direction and then moving the light-emitting panel to slide in the direction opposite to the overhanging direction so as to be detached" and has low cost, high strength, and highly reliability.

That is, according to these aspects, since the recess and the projection that are required when the push-push type eject mechanism is employed in the attachment side fitting part are provided in a part of the overhanging part, it is possible to easily achieve the operation of "moving the panel side fitting part to slide in the overhanging direction of the overhanging part to form a fitting state, and once moving the panel side fitting part to slide in the overhanging direction and then moving the panel side fitting part to slide in the direction opposite to the overhanging direction to release the fitting state" as the operation of this aspect.

In preferred aspect, the overhanging part includes a plurality of engagement pieces, the plurality of engagement pieces include the one engagement piece and the other engagement piece, and a part of the edge of the other engagement piece includes a combination of any segments of the following (1) to (3) in plan view.

(1) the straight line segment and the straight line segment
(2) the straight line segment and the uneven segment
(3) the uneven segment and the uneven segment In the above aspect, the overhanging part may include two or more engagement pieces each interposed between the two segments.

In these aspects, the overhanging part is provided with the plurality of engagement pieces. Thus, for example, the overhanging part may include two power supply fitting pieces that can perform power supply independently on positive and negative sides and prevent a short circuit caused by contact between the power supply terminals, or the overhanging part may include a power supply fitting piece and a signal fixing piece (described below) that is one kind of engagement pieces and capable of transmitting a noise-cancelled signal from the outside to the panel. More preferably, the overhanging part includes, as engagement pieces, two power supply fitting pieces and a signal fixing piece.

In other words, for example, providing power supply terminals capable of preforming power supply as positive and negative terminals in the respective engagement pieces enables a short circuit between the power supply terminals to be prevented. Further, providing a signal terminal capable of transmitting a signal from the outside and receiving a signal to the outside in the engagement piece enables the generation of noise to be reduced. More preferably, three or more engagement pieces are provided, and positive and negative power supply terminals and a signal terminal are disposed on the engagement pieces.

In the above aspect, the overhanging part may include at least two engagement pieces, one of the engagement pieces and the other engagement piece may be disposed with a predetermined space therebetween, the attachment side fitting part may include an opening and a blocking part blocking a part of the opening, the panel side fitting part may be fittable with the attachment side fitting part by inserting the two engagement pieces into the opening, and the blocking part may be interposed between the two engagement pieces in the fitting state.

According to this aspect, the blocking part blocks a part of the opening, and the blocking part is located between the engagement pieces which are arranged side by side with a predetermined space therebetween in the fitting state. Thus, it is possible to prevent a user from mistakenly fitting a fitting part other than the panel side fitting part with the attachment side fitting part.

Effect of Invention

According to the light-emitting panel attachment structure of the present invention, it is possible to attach the light-emitting panels with no gap therebetween to the installation surface such as a ceiling.

According to the light-emitting panel aligned-arrangement structure of the present invention, it is possible to arrange the light-emitting panels with substantially no gap formed therebetween.

According to the light-emitting panel of the present invention, it is possible to attach the light-emitting panels with no gap therebetween to the installation surface such as a ceiling and easily perform attachment/detachment to or from the installation surface.

BRIEF DESCRIPTION OF DRAWINGS

FIGS. 4A to 4C are sectional views of the light-emitting panel attachment structure of FIG. 2, wherein FIG. 4A illustrates an A-A cross section, FIG. 4B illustrates a B-B cross section, and FIG. 4C illustrates a C-C cross section.

FIGS. 14A and 14B are sectional views each illustrating a principal part of the light-emitting panel attachment structure of FIG. 2 in each orientation, wherein FIG. 14A illustrates a parallel orientation, and FIG. 14B illustrates an intersecting orientation.

FIGS. 15A and 15B are sectional views each illustrating the principal part of the light-emitting panel attachment structure of FIG. 2 in each orientation, wherein FIG. 15A illustrates a basic orientation, and FIG. 15B illustrates an extending state.

FIGS. 18A and 18B are conceptual diagrams illustrating a movable range of a light-emitting panel of the second embodiment of the present invention, wherein FIG. 18A illustrates a change between a parallel orientation and an intersecting orientation, and FIG. 18B illustrates a change between a basic orientation and an extending orientation.

FIGS. 22A and 22B are sectional views each illustrating a principal part of the light-emitting panel attachment structure of the fourth embodiment in each orientation, wherein FIG. 22A illustrates a parallel orientation, and FIG. 22B illustrates an intersecting orientation.

FIGS. 23A and 23B are sectional views each illustrating a principal part of a light-emitting panel attachment structure of a fifth embodiment in each orientation, wherein FIG. 23A illustrates a parallel orientation, and FIG. 23B illustrates a vertical orientation.

FIGS. 24A and 24B are sectional views each illustrating the principal part of the light-emitting panel attachment structure of the fifth embodiment in each orientation, wherein FIG. 24A illustrates a basic orientation, and FIG. 24B illustrates an extending orientation.

BEST MODE FOR CARRYING OUT THE INVENTION

The present invention mainly relates to an attachment structure 1 for a light-emitting panel used as a lighting apparatus. Hereinbelow, up, down, right and left positional relationships will be described based on an orientation in FIG. 2 unless otherwise specifically noted. That is, a light extraction side of a light-emitting panel 2 during lighting corresponds to the lower side. Physical properties described below indicate physical properties in a normal state unless otherwise specifically noted. Each drawing may be exaggerated as a whole compared to its actual size (length, width, or thickness) to facilitate understanding.

Figure 1:
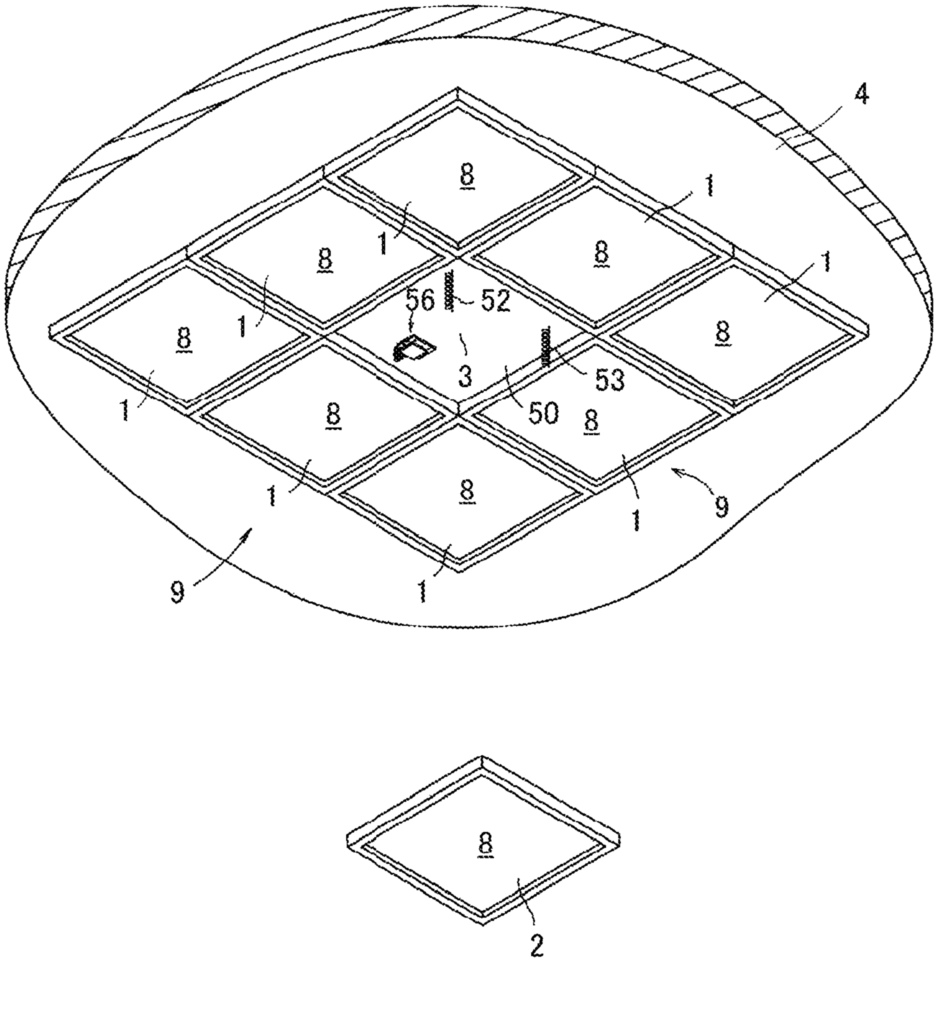
FIG. 1 is an exploded perspective view schematically illustrating a state in which a light-emitting panel is detached from a light-emitting panel aligned-arrangement structure according to a first embodiment of the present invention.

As illustrated in FIG. 1, the light-emitting panel attachment structure 1 of a first embodiment of the present invention attaches the light-emitting panel 2 to an installation surface 4 such as a ceiling or a wall.

The light-emitting panel attachment structure 1 is arranged together with a plurality of light-emitting panel attachment structures 1 to form a light-emitting panel aligned-arrangement structure 9.

The light-emitting panel attachment structure 1 of the first embodiment has one of its characteristics in turning the light-emitting panel 2 in a direction perpendicular to the installation surface 4 to bring the light-emitting panel 2 into a predetermined orientation to enable detachment/attachment of the light-emitting panel 2.

Figure 2:
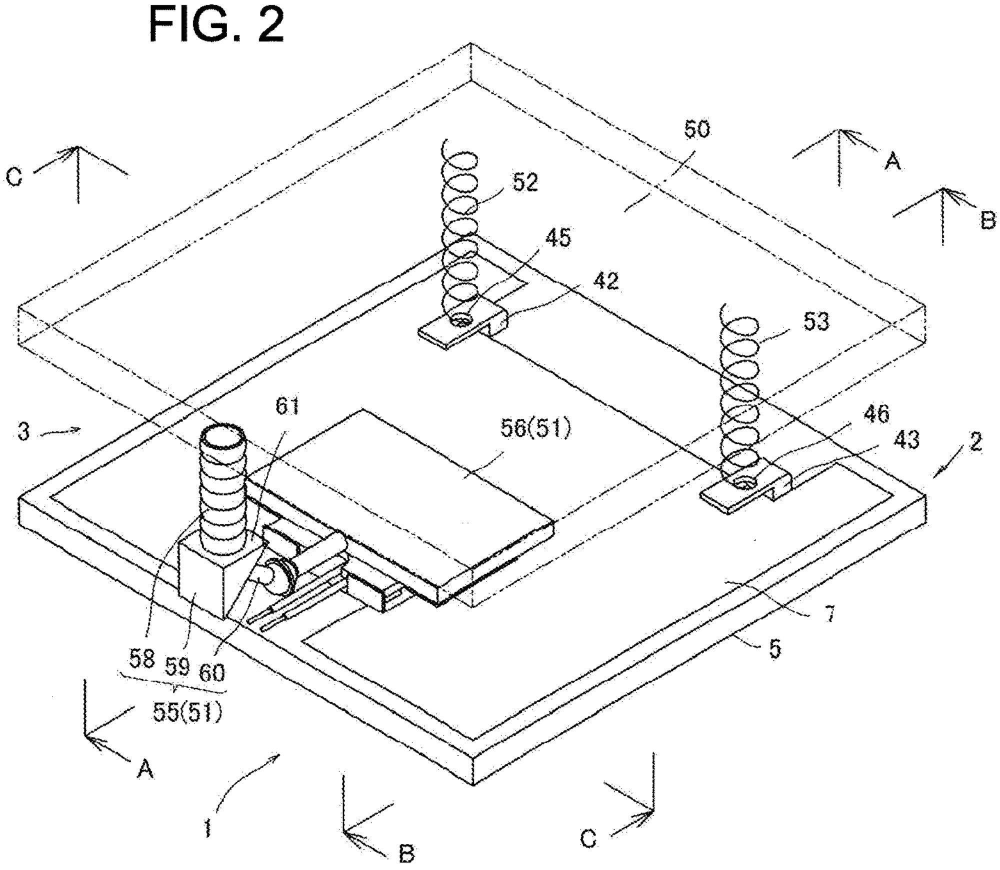
FIG. 2 is a perspective view schematically illustrating a light-emitting panel attachment structure according to the first embodiment of the present invention.

As illustrated in FIG. 2, the light-emitting panel attachment structure 1 is provided with the light-emitting panel 2 and an attachment device 3.

Figure 5:
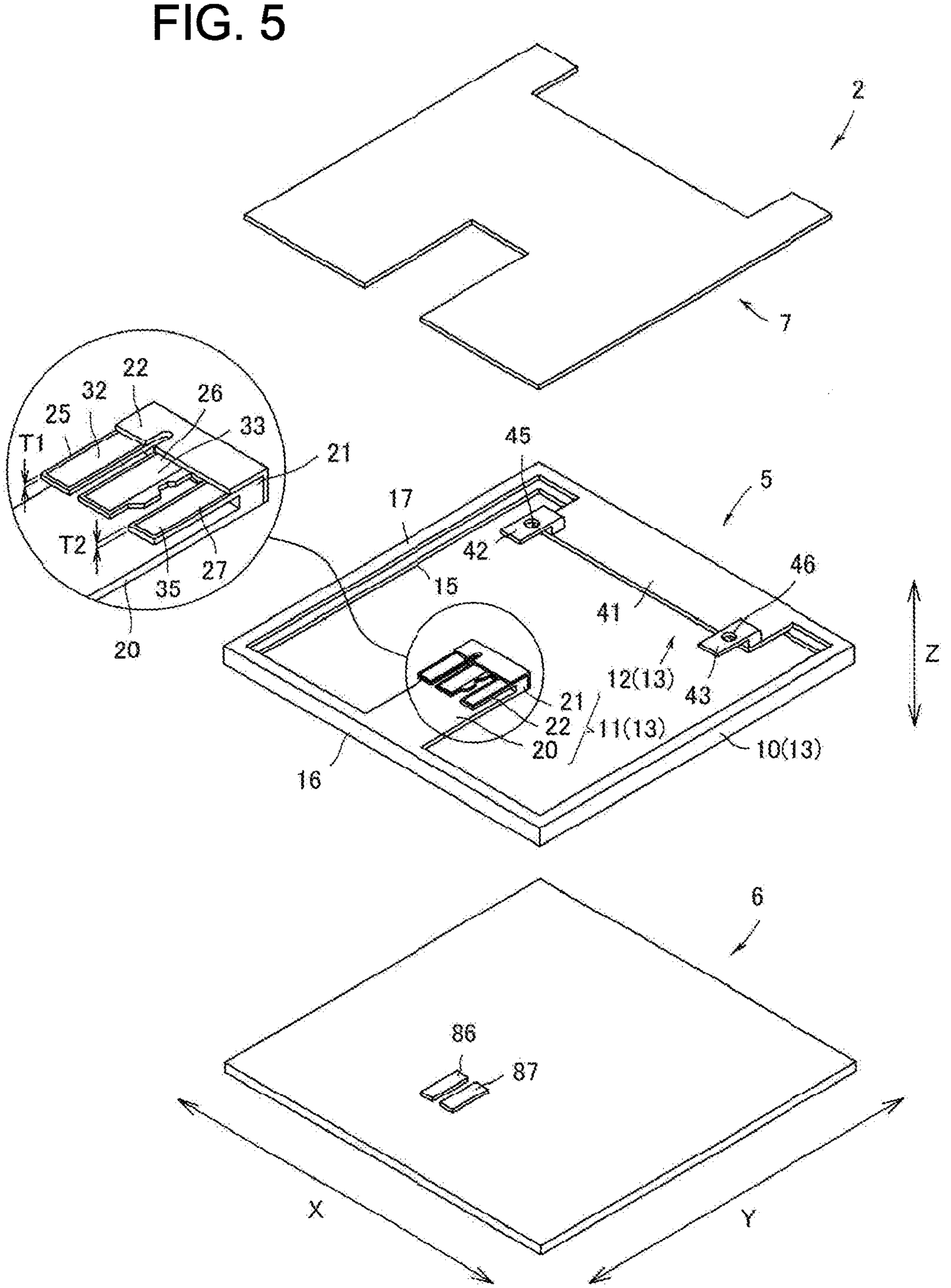
FIG. 5 is an exploded perspective view of a light-emitting panel of FIG. 3.

As illustrated in FIG. 5, the light-emitting panel 2 includes a frame member 5, an organic EL panel 6 (panel body) and an reinforcement member 7, with a constituent member (not illustrated) obtained by adding a required member to these members.

The frame member 5 functions as a frame of the organic EL panel 6 and fixes the organic EL panel 6 to the attachment device 3 (refer to FIG. 2).

As illustrated in FIG. 5, the frame member 5 includes a periphery cover part 13 which covers a peripheral part of a principal surface of the organic EL panel 6.

The periphery cover part 13 includes a casing part 10, a panel side fitting part 11 and a panel side fixing part 12, with a constituent part (not illustrated) obtained by adding a necessary part to these parts.

Figure 4A:
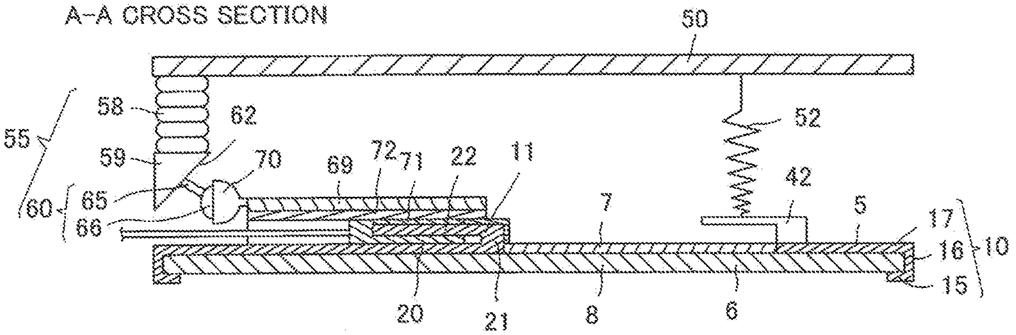
Figure 4B:
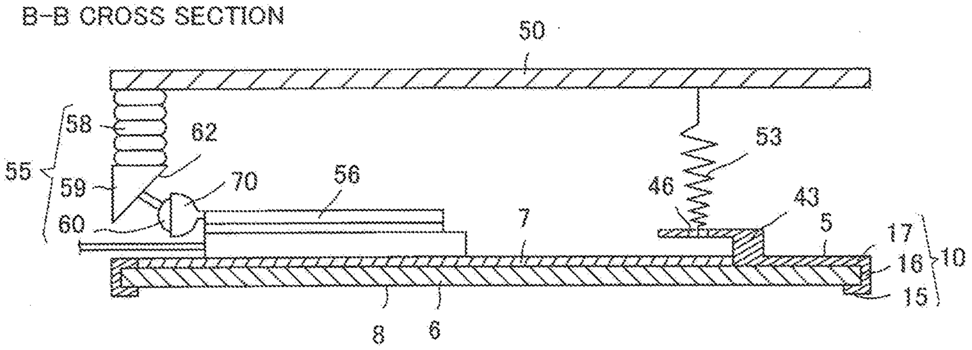
Figure 4C:
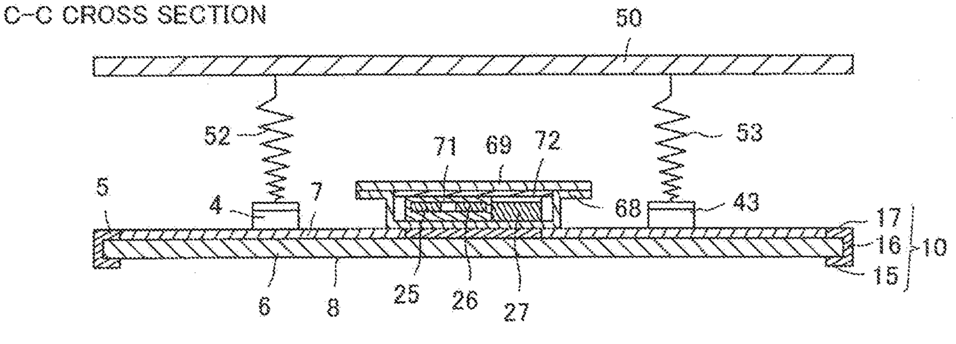

As can be seen from FIGS. 4A to 4C, the casing part 10 covers at least a part of the peripheral part of the organic EL panel 6.

Specifically, the casing part 10 covers an end face of the organic EL panel 6 and has a quadrangular annular shape in plan view. That is, the casing part 10 extends along each side of the organic EL panel 6.

As illustrated in FIGS. 4A to 4C, the casing part 10 has a substantially "U"-shaped cross section and includes an emission side cover part 15, an end face cover part 16 and a back face side cover part 17.

As illustrated in FIG. 5, the emission side cover part 15 and the back face side cover part 17 are disposed with a predetermined space therebetween so as to face each other in an up-down direction Z. The end face cover part 16 connects an end of the emission side cover part 15 and an end of the back face side cover part 17. In other words, the end face cover part 16 is formed in a standing manner with respect to the emission side cover part 15 and also with respect to the back face side cover part 17.

As illustrated in FIGS. 4A to 4C, the emission side cover part 15 covers a side having an emission surface 8 of the organic EL panel 6 when the light-emitting panel 2 is assembled. The end face cover part 16 covers the end face of the organic EL panel 6 when the light-emitting panel 2 is assembled. The back face side cover part 17 covers the back face of the organic EL panel 6 when the light-emitting panel 2 is assembled.

The end face cover part 16 is preferably inclined downward from the back face side cover part 17 to the emission side cover part 15 in a gently rounded manner. That is, the size of an outer edge of the emission side cover part 15 is preferably smaller than the size of an outer edge of the back face side cover part 17.

As can be seen from FIGS. 4A to 4C and FIG. 5, the panel side fitting part 11 has a "U"-shaped cross section.

The panel side fitting part 11 includes an extending part 20 which extends from the back face side cover part 17 to the center, a standing wall part 21 which stands from an extending direction end of the extending part 20, and an overhanging part 22 which overhangs from a tip of the standing wall part 21 in an overhanging direction which is parallel to the extending direction of the extending part 20.

That is, in the panel side fitting part 11, the extending part 20 and the overhanging part 22 are located parallel to each other with a predetermined space therebetween in the up-down direction. A central side end of the extending part 20 and a central side end of the overhanging part 22 are connected through the standing wall part 21.

In the panel side fitting part 11 of the present embodiment, the overhanging direction of the overhanging part 22 from the standing wall part 21 is opposite to the extending direction of the extending part 20 to the standing wall part 21. That is, in the panel side fitting part 11, the extending part 20 and the overhanging part 22 face each other with the predetermined space therebetween in the up-down direction.

As illustrated in FIG. 5, the extending part 20 is a tongue-shaped part that extends in a length direction Y from a central part in the width direction of the back face side cover part 17. The standing wall part 21 maintains the space between the extending part 20 and the overhanging part 22. The overhanging part 22 maintains a fitting state with an attachment side fitting part 56 during fitting.

As illustrated in an enlarged view of FIG. 5, the overhanging part 22 includes two power supply fitting pieces 25, 26 (engagement pieces) and a signal fixing piece 27 (engagement piece, fitting piece).

The two power supply fitting pieces 25, 26 and the signal fixing piece 27 are parallel to each other in a width direction X. The power supply fitting piece 25, the power supply fitting piece 26, and the signal fixing piece 27 are arranged side by side in this order from one side to the other side in the width direction X.

Figure 6:
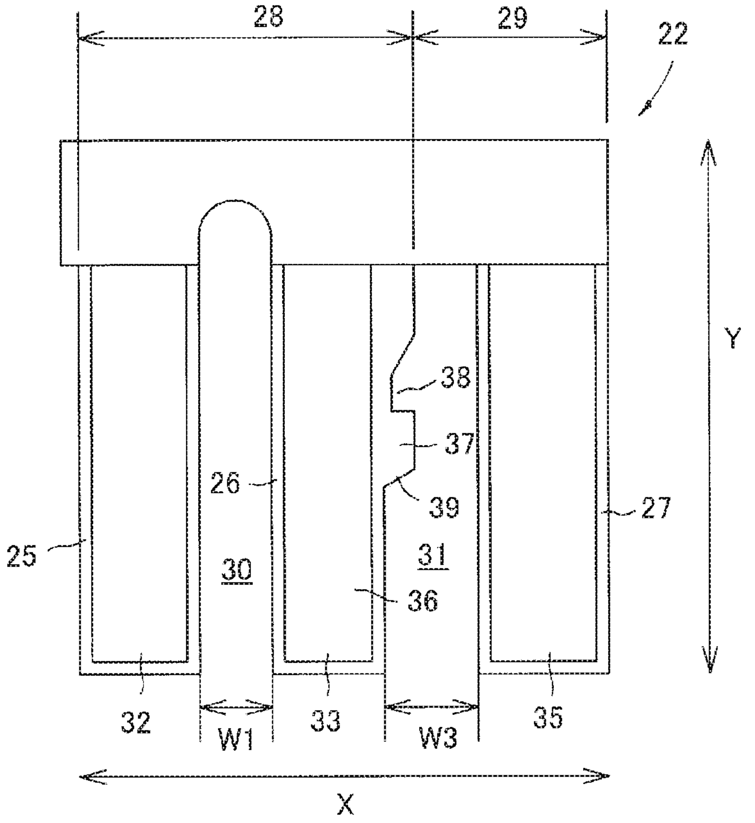
FIG. 6 is a plan view of an overhanging part of FIG. 5.

As illustrated in FIG. 6, the power supply fitting piece 25 is a rectangular small piece whose long side is aligned with the length direction Y and includes a panel side power supply terminal 32.

The panel side power supply terminal 32 is a part that is electrically connected to a panel side power supply part 86 of the light-emitting panel 2 when the light-emitting panel 2 is assembled. The panel side power supply terminal 32 is a part that serves as an electrical contact to an attachment side power supply terminal 90 when the light-emitting panel 2 is attached to the attachment device 3.

As illustrated in FIG. 6, the power supply fitting piece 26 is a substantially rectangular small piece whose long side is aligned with the length direction Y and includes a panel side power supply terminal 33.

The panel side power supply terminal 33 is a part that is electrically connected to a panel side power supply part 87 of the light-emitting panel 2 when the light-emitting panel 2 is assembled. The panel side power supply terminal 33 is a part that serves as an electrical contact to an attachment side power supply terminal 91 when the light-emitting panel 2 is attached to the attachment device 3.

As illustrated in FIG. 6, the signal fixing piece 27 is a substantially rectangular small piece whose long side is aligned with the length direction Y and includes a signal conductive part 35.

The signal conductive part 35 transmits a command controlled by a mounting part 72 (refer to FIG. 8) to the organic EL panel 6. A thickness T2 of the signal fixing piece 27 is larger than a thickness T1 of the power supply fitting pieces 25, 26 as illustrated in the enlarged view of FIG. 5. The signal fixing piece 27 has a higher stiffness than the power supply fitting pieces 25, 26.

As illustrated in FIG. 6, the power supply fitting piece 26 located on the center includes a body part 36, a locking piece 37, and a fixing cut-away part 38.

The body part 36 serves as a framework of the power supply fitting piece 26 and is provided with the panel side power supply terminal 33.

The locking piece 37 is a part that projects from one end in the width direction X of the body part 36 (the end facing the signal fixing piece 27) toward the signal fixing piece 27. The locking piece 37 has an inclined surface 39 which is formed on a tip surface in the projecting direction Y of the power supply fitting piece 26 and inclined toward the body part 36.

The fixing cut-away part 38 is continuous with the locking piece 37 in the length direction Y and cut away toward the center of the body part 36.

In the fitting pieces 25, 26 and the signal fixing piece 27, an edge on one side in the width direction X of the power supply fitting piece 26 located on the center is partially or entirely formed of a straight line segment which linearly extends from the overhanging direction tip of the overhanging part 22 to the standing wall part 21 in plan view as illustrated in FIG. 6. On the other hand, an edge on the other side in the width direction X of the power supply fitting piece 26 is partially or entirely formed of an uneven segment which extends from the overhanging direction tip of the overhanging part 22 to the standing wall part 21 through a recess and a projection in plan view.

On the other hand, as illustrated in FIG. 6, edges on both sides in the width direction X of the power supply fitting piece 25 and edges on both sides in the width direction X of the signal fixing piece 27 are partially or entirely formed of straight line segments each of which linearly extends from the overhanging direction tip of the overhanging part 22 to the standing wall part 21 in plan view.

From another point of view, as illustrated in FIG. 6, the overhanging part 22 is divided into a plurality of parts by cut-away parts 30, 31, and the two power supply fitting pieces 25, 26 and the signal fixing piece 27 are formed thereon.

The cut-away part 30 is provided for preventing a short circuit between the power supply fitting pieces 25, 26 and also for avoiding contact with a blocking part 78 (refer to FIG. 11) of the mounting part 72 during fitting. That is, a width W1 of the cut-away part 30 is larger than a width W2 (refer to FIG. 8) of the blocking part 78 of the mounting part 72. In other words, the power supply fitting pieces 25, 26 are separated from each other by a distance that is larger than the width of the blocking part 78 of the mounting part 72.

The cut-away part 31 is provided for preventing a short circuit between the power supply fitting piece 26 and the signal fixing piece 27 and also for avoiding contact with a side wall part 107 (refer to FIG. 8) of a fitting receiving part 71 during fitting. That is, a width W3 of the cut-away part 31 is larger than a width W4 (refer to FIG. 10) between a slide member 96 of the fitting receiving part 71 and the side wall part 107. In other words, the power supply fitting piece 26 and the signal fixing piece 27 are separated from each other by a distance that is larger than the width W4 between the slide member 96 of the fitting receiving part 71 and the side wall part 107.

As illustrated in FIG. 6, the cut-away part 31 includes, as a segment, a recess and a projection formed by end faces of the locking piece 37 and the fixing cut-away part 38 from the overhanging direction tip of the overhanging part 22 toward a base end side (the side having the standing wall part 21) in plan view. That is, the cut-away part 31 includes the uneven segment described above.

From still another point of view, as illustrated in FIG. 6, the cut-away part 31 divides the overhanging part 22 into an insertion region 28 which is inserted into an insertion space 75 of the fitting receiving part 71 during fitting with the attachment side fitting part 56 and an exposure region 29 which is located on the outer side of the fitting receiving part 71. That is, the power supply fitting pieces 25, 26 are located in the insertion region 28, and the signal fixing piece 27 is located in the exposure region 29.

As illustrated in FIG. 5, the panel side fixing part 12 which is located opposite to the panel side fitting part 11 includes an extending part 41 which extends in the length direction Y from the back face side cover part 17 to the center and fixing pieces 42, 43 which are formed on the respective ends in the width direction X of the extending part 41.

Each of the fixing pieces 42, 43 is a part that is continuous with the extending part 41 in a stepped form and extends toward the center. The fixing piece 42 has a fixing hole 45 which is formed near an end in the extending direction Y thereof, and the fixing piece 43 has a fixing hole 46 which is formed near an end in the extending direction Y thereof.

Attachment side fixing parts 52, 53 of the attachment device 3 are insertable into the fixing holes 45, 46, respectively. Specifically, the fixing holes 45, 46 are through holes which respectively penetrate the fixing pieces 42, 43 in a member thickness direction.

Figure 7:
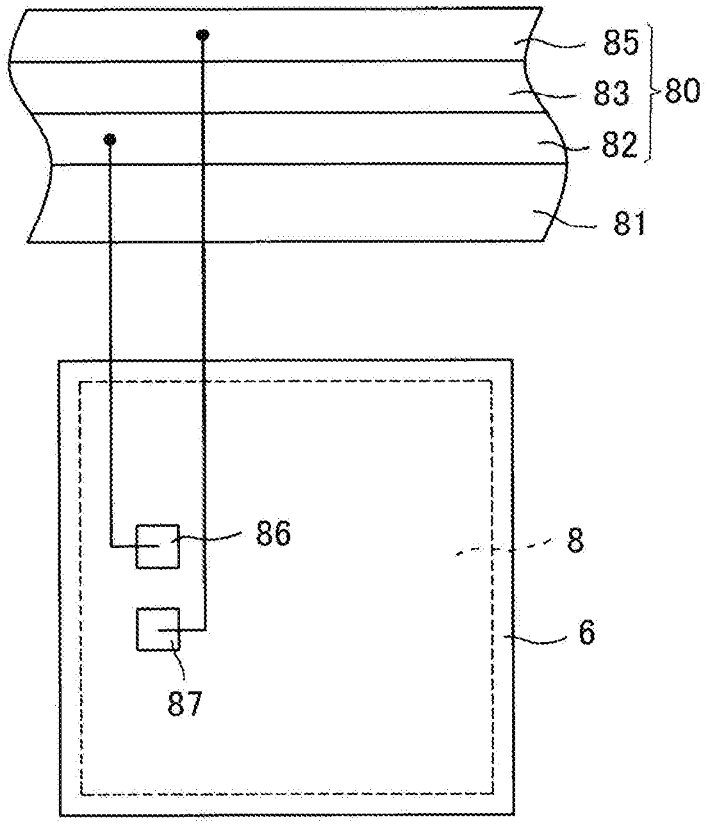
FIG. 7 is a schematic view illustrating a correspondence relationship between panel side power supply parts of FIG. 5 and each layer of an organic EL element.

As illustrated in FIG. 7, the organic EL panel 6 (panel body) includes a built-in organic EL element 80 (light-emitting element) and the emission surface 8 (refer to FIG. 1) on one principal surface (one side) thereof.

That is, the organic EL panel 6 is a planar light source, and has a built-in laminated structure which includes a substrate 81 having planar expansion and the organic EL element 80 which is laminated on the substrate 81 as illustrated in FIG. 7.

The organic EL element 80 has a laminated structure which includes at least a first electrode layer 82, an organic light-emitting layer 83, and a second electrode layer 85 laminated in this order from the substrate 81.

The organic EL panel 6 of the present embodiment is a bottom emission type organic EL panel which extracts light from the side having the substrate 81.

The organic EL panel 6 is a polygonal plate-like panel. In the present embodiment, the organic EL panel 6 is a quadrangular plate-like panel. That is, the organic EL panel 6 has two sides facing each other in the plane direction.

As can be seen from FIG. 5, the organic EL panel 6 includes the panel side power supply parts 86, 87 on an opposite face (the face opposite to the face having the emission surface 8).

That is, the substrate 81 is located at the side having the emission surface 8, and the second electrode layer 85 is located at the side having the panel side power supply parts 86, 87.

As illustrated in FIG. 7, the panel side power supply part 86 is electrically connected to the first electrode layer 82 of the organic EL element 80, and the panel side power supply part 87 is electrically connected to the second electrode layer 85 of the organic EL element 80. Inside the organic EL panel 6, a conductive path which connects the panel side power supply part 86 to the panel side power supply part 87 through the first electrode layer 82, the organic light-emitting layer 83, and the second electrode layer 85 is formed. Thus, in the organic EL panel 6, the organic light-emitting layer 83 emits light and the emission surface 8 thereby emits light by application of voltage across the panel side power supply parts 86, 87.

As illustrated in FIG. 5, the reinforcement member 7 is a plate-like member that reinforces the stiffness of the organic EL panel 6 and is formed in a manner to avoid contact with the panel side fitting part 11 and the panel side fixing part 12.

The material of the reinforcement member 7 is not particularly limited to any material as long as it is capable of reinforcing the stiffness of the organic EL panel 6. Examples of the material of the reinforcement member 7 include simple metals such as aluminum, iron, nickel, cobalt, and gadolinium, alloys of these metals, and oxides of these metals.

The reinforcement member 7 of the present embodiment is formed of an aluminum plate.

Here, a positional relationship between the constituent parts of the light-emitting panel 2 will be described.

As can be seen from FIGS. 3, 4A to 4C, and 5, in the light-emitting panel 2, the reinforcement member 7 is mounted on the organic EL panel 6, and the frame member 5 covers the end of the organic EL panel 6. The reinforcement member 7 is disposed in a manner to avoid contact with the frame member 5.

Specifically, at least a part of the reinforcement member 7 is arranged between the extending parts 20, 41 which extend in directions approaching each other in plan view of the organic EL panel 6. That is, the part of the reinforcement member 7 is arranged between the extending direction end of the extending part 20 and the periphery cover part 13.

As illustrated in FIGS. 4A to 4C, the reinforcement member 7 is in contact with the extending part 20 and the casing part 10 of the periphery cover part 13 in the plane direction. In the present embodiment, the reinforcement member 7 is in contact with the extending direction end of the extending part 20 and the casing part 10 of the periphery cover part 13.

Further, the reinforcement member 7 is in contact with the back face (the face opposite to the emission surface 8) of the organic EL panel 6 in the thickness direction.

The panel side fitting part 11 of the frame member 5 is located on the principal surface of the organic EL panel 6, the principal surface being located opposite to the emission surface 8. That is, in the entire light-emitting panel 2, the emission surface 8 is located on one principal surface (the light-emitting side principal surface) of the light-emitting panel 2, and the panel side fitting part 11 is located on the other principal surface (the back face side principal surface).

As illustrated in FIGS. 4A to 4C, the power supply fitting pieces 25, 26 and the signal fixing piece 27 are parallel to the emission surface 8 of the organic EL panel 6. The power supply fitting pieces 25, 26 and the signal fixing piece 27 are located on the inner side of the light-emitting panel 2 as well as near the end of the light-emitting panel 2 in plan view of the light-emitting panel 2. The projecting direction of the power supply fitting pieces 25, 26 and the signal fixing piece 27 is the same as the extending direction of the fixing pieces 42, 43.

Figure 3:
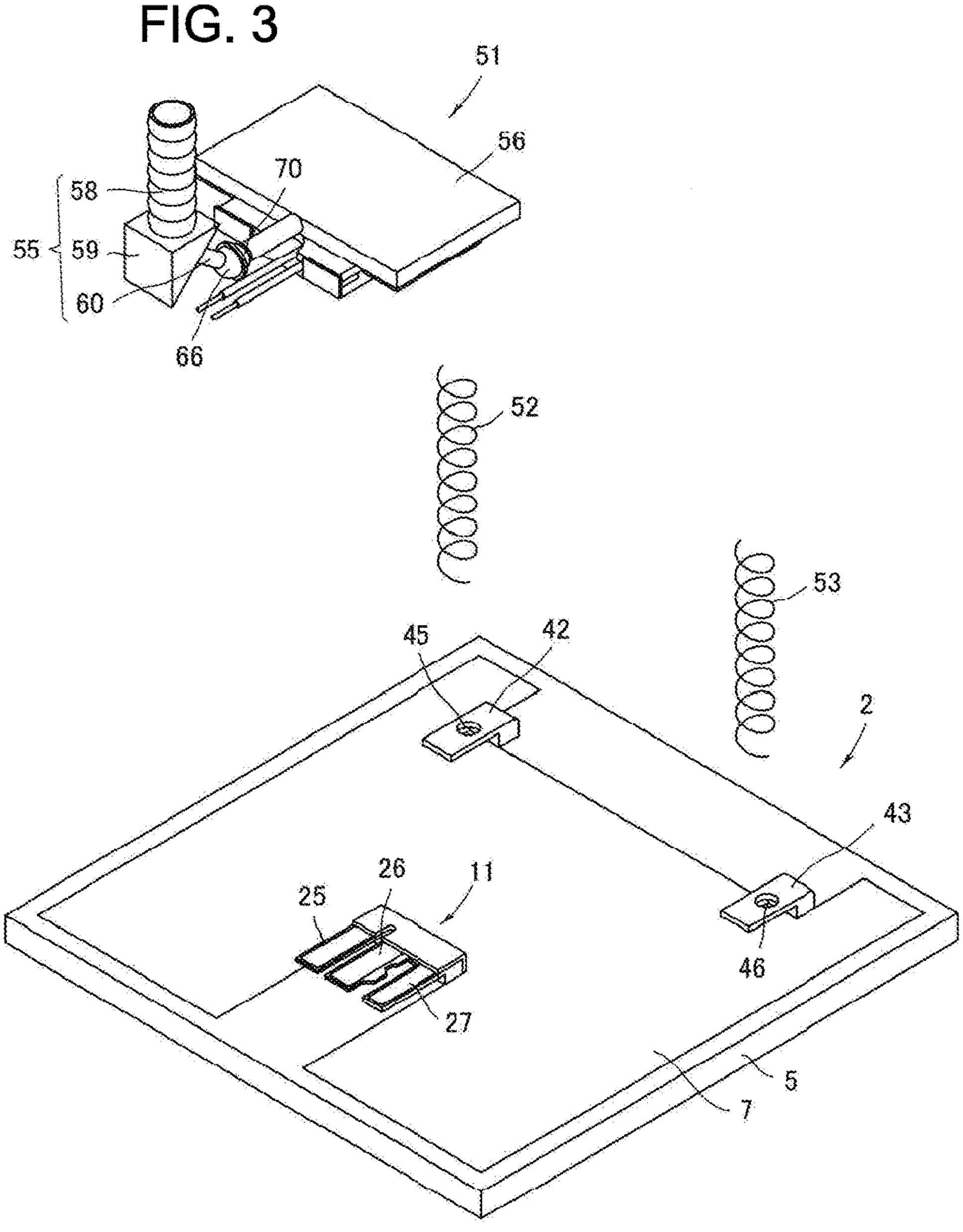
FIG. 3 is an exploded perspective view of the light-emitting panel attachment structure of FIG. 2.

As can be seen from FIG. 3, the power supply fitting pieces 25, 26 and the signal fixing piece 27, and the fixing holes 45, 46 of the fixing pieces 42, 43 are distributed with a predetermined space therebetween in plan view of the light-emitting panel 2.

As can be seen from FIGS. 2 and 3, the attachment device 3 includes a base part 50 (fixing part), an attachment part 51, and attachment side fixing parts 52, 53.

As illustrated in FIGS. 4A to 4C, the base part 50 is fixed to the installation surface 4 such as a ceiling and serves as a base of the attachment device 3.

The attachment part 51 attaches the light-emitting panel 2 to the base part 50 and includes an orientation changing part 55 and an attachment side fitting part 56.

As illustrated in FIG. 3, the orientation changing part 55 includes an extensible part 58 which is capable of extension and contraction, a connection part 59, and a coupling part 60.

The extensible part 58 is fixed to the base part 50 in a suspended manner and capable of extension and contraction in the up-down direction (the direction perpendicular to the base part 50). Specifically, the extensible part 58 is an accordion hose.

As illustrated in FIG. 2, the connection part 59 connects the extensible part 58 and the coupling part 60 therethrough.

The connection part 59 is a triangular-pole shaped part having a right-angled triangular cross section, and has an orientation with the triangular pole inclined in the horizontal direction. That is, as illustrated in FIGS. 4A to 4C, an inclined surface 62 of the connection part 59 faces downward in a direction that intersects the base part 50.

Figure 9:
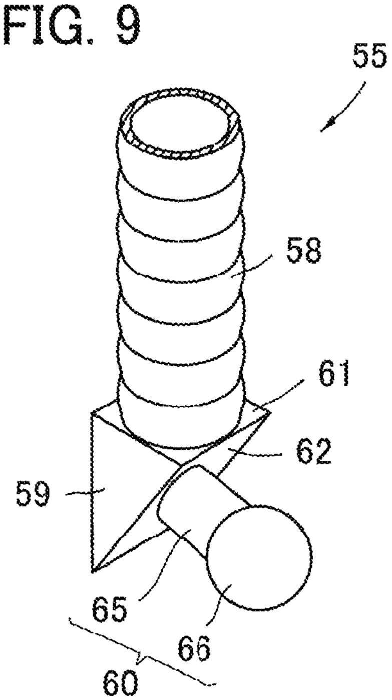
FIG. 9 is a perspective view illustrating an orientation changing part of the attachment device of FIG. 3.

As illustrated in FIG. 9, the coupling part 60 includes a shaft part 65 and a ball part 66.

The shaft part 65 is a cylindrical part that projects in a perpendicular direction from the inclined surface 62 of the connection part 59. The ball part 66 is connected to the shaft part 65 at a projecting direction end thereof.

The ball part 66 is a substantially spherical part that is engageable with a ball receiving part 70 (described below) of the attachment side fitting part 56. The ball part 66 is housed inside the ball receiving part 70 of the attachment side fitting part 56 to function as a ball joint. That is, the ball part 66 serves as a turning center of the light-emitting panel 2.

Figure 8:
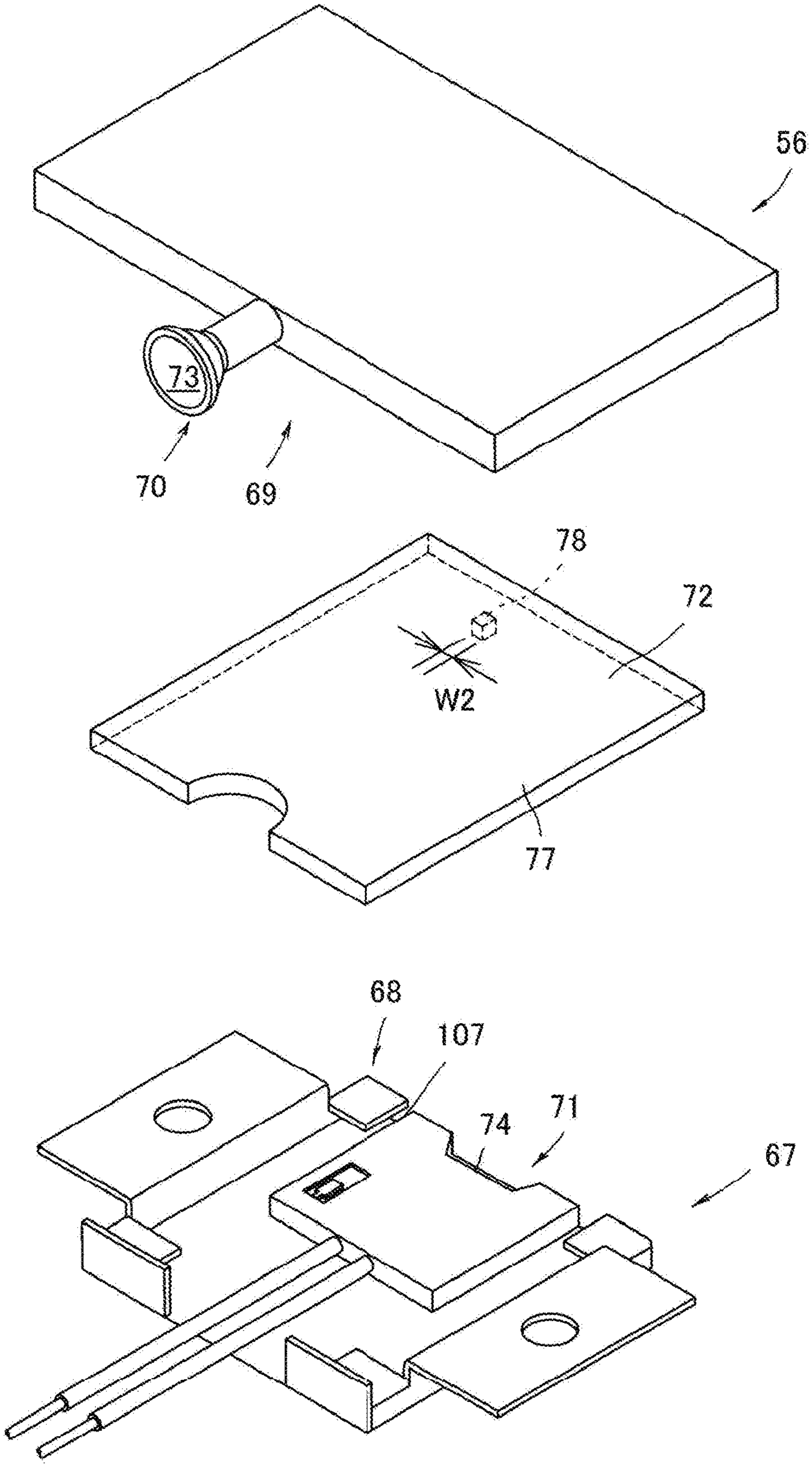
FIG. 8 is an exploded perspective view of an attachment side fitting part of an attachment device of FIG. 3.

As illustrated in FIG. 8, the attachment side fitting part 56 includes a framework part 69, a body part 67, and the mounting part 72.

The framework part 69 forms a framework of the attachment side fitting part 56 and includes the ball receiving part 70.

The ball receiving part 70 is paired with the ball part 66 (refer to FIG. 9) of the coupling part 60 and includes a housing space 73 which is capable of partially or entirely housing the ball part 66. The ball receiving part 70 has a concave spherical inner surface.

As illustrated in FIG. 8, the body part 67 includes a placement part 68 and a fitting receiving part 71.

The placement part 68 places thereon the fitting receiving part 71 and fixes the position of the fitting receiving part 71 with respect to the framework part 69.

The fitting receiving part 71 is fittable with the power supply fitting pieces 25, 26 of the light-emitting panel 2.

Figure 10:
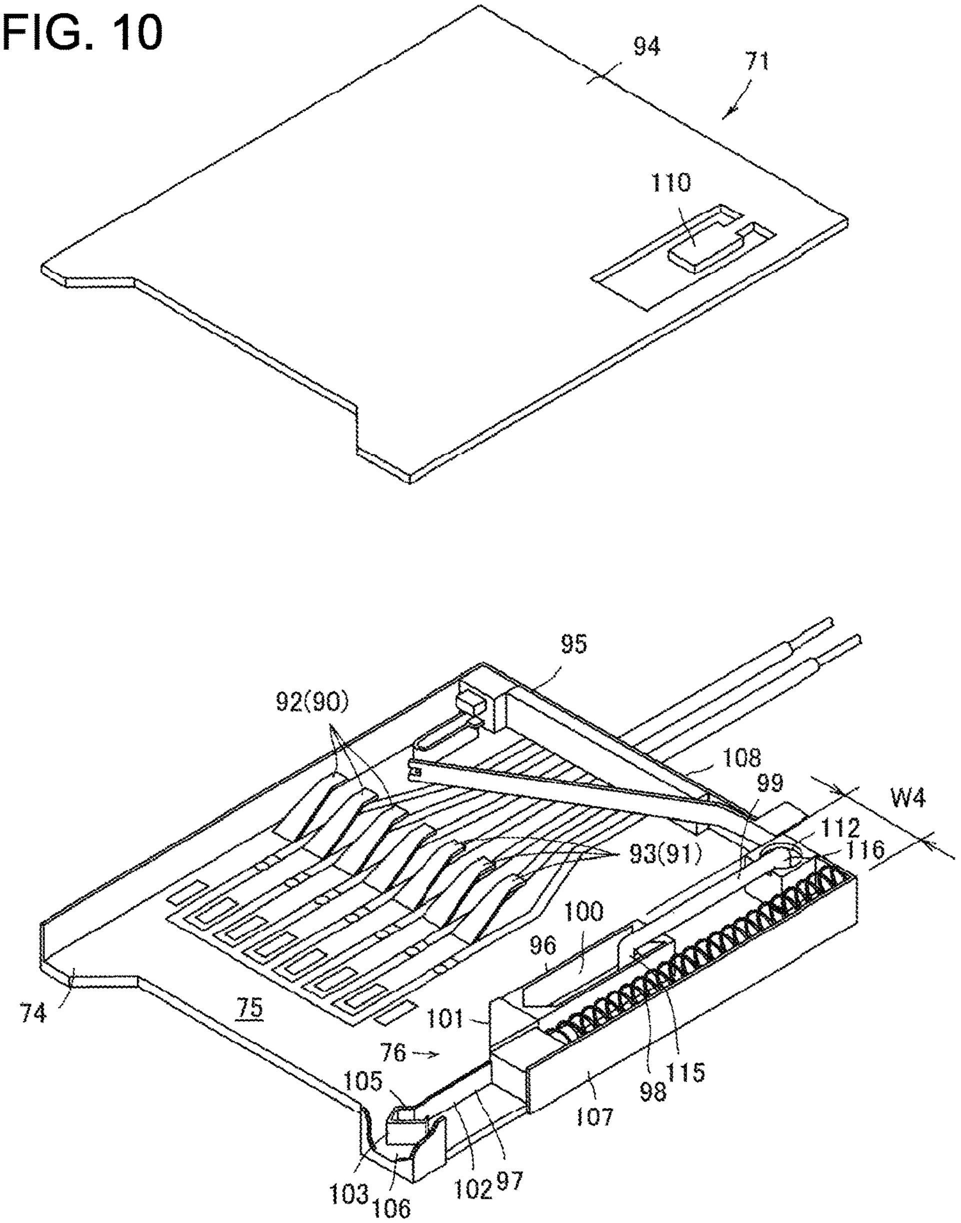
FIG. 10 is an exploded perspective view of a fitting receiving part of FIG. 3.

As illustrated in FIG. 10, the fitting receiving part 71 is a box-shaped body open in one direction and includes, inside thereof, an insertion space 75 into which the power supply fitting pieces 25, 26 can be inserted.

The insertion space 75 is surrounded by a casing part 95 and a cover part 94 and communicates with the outside through an insertion opening 74 which is formed by the casing part 95 and the cover part 94. That is, one end of the fitting receiving part 71 forms an open end.

As illustrated in FIG. 10, the fitting receiving part 71 includes the attachment side power supply terminals 90, 91 inside the insertion space 75.

The attachment side power supply terminals 90, 91 are electrically connectable to an external power source. The attachment side power supply terminals 90, 91 include a plurality of contact parts 92, 93, respectively.

The contact parts 92, 93 come into contact with the panel side power supply terminals 32, 33 of the panel side fitting part 11 when the light-emitting panel 2 is attached to the attachment device 3.

The contact parts 92, 93 are arrayed in a row in the width direction. The contact parts 92, 93 are known cantilever contacts.

As illustrated in FIG. 10, the fitting receiving part 71 is provided with, inside thereof, a push-push type eject mechanism 76.

In the eject mechanism 76, the power supply fitting piece 26 is locked by pushing the power supply fitting pieces 25, 26 into the insertion space 75, and the lock is released by again pushing the power supply fitting pieces 25, 26 so that the power supply fitting pieces 25, 26 can be ejected from the insertion space 75.

Specifically, the eject mechanism 76 includes a slide member 96, a flat spring 97, a compression coil spring 98, and a guide rod 99.

The slide member 96 is slidable along a side wall part 107 of the fitting receiving part 71. The slide member 96 includes an engagement surface 101 which abuts against the inclined surface 39 of the locking piece 37 when the power supply fitting piece 26 is inserted. The engagement surface 101 is an inclined surface having the same inclination as the inclined surface 39 (refer to FIG. 6) of the locking piece 37.

The slide member 96 includes a cam groove 100 having a heart shape in plan view.

The cam groove 100 includes a locking groove (not illustrated) which is recessed in a V shape, and includes an advance side path which forms a trajectory from a starting point toward the locking groove (not illustrated) and a return side path which forms a trajectory from the locking groove (not illustrated) toward the starting point. That is, a trajectory of a drive part 115 of the guide rod 99 inside the cam groove 100 includes the advance side path and the return side path and forms an irreversible continuous trajectory in which the drive part 115 does not move backward on the whole way although the drive part 115 may partially move backward.

As illustrated in FIG. 10, the flat spring 97 is formed by bending a single plate-like body, and includes a projecting piece 102 and an inverted piece 103.

The projecting piece 102 projects toward the center of the insertion space 75 and includes a first bent part 105 formed near a connection part connected to the inverted piece 103.

The first bent part 105 locks the power supply fitting piece 26 when the power supply fitting pieces 25, 26 are inserted into the fitting receiving part 71.

The inverted piece 103 is a part that is bent from the projecting piece 102 and inverted toward the end of the projecting piece 102.

The inverted piece 103 includes a second bent part 106 formed near the end thereof. The second bent part 106 is formed facing opposite to the first bent part 105.

The compression coil spring 98 is a member that energizes the slide member 96 in an inserting direction of the power supply fitting pieces 25, 26.

The guide rod 99 is a “U”-shaped linear body, and includes the drive part 115 which is coupled to the cam groove 100 and a fixing part 116 which is fixed to a hole 112 of a stop wall 108. That is, the drive part 115 of the guide rod 99 can be driven inside the heart-shaped cam groove 100 using the fixing part 116 as a fulcrum.

The cover part 94 is provided with a cantilever spring piece 110 which energizes the guide rod 99 toward the bottom face of the cam groove 100.

A guide groove (not illustrated) which restricts movement of the slide member 96 is formed near the side wall part 107 which forms the wall surface of the casing part 95. The guide groove (not illustrated) is a part that restricts movement of the slide member 96 other than linear movement.

Here, a positional relationship between the parts of the fitting receiving part 71 will be described. One end (base end) of the projecting piece 102 is fixed to the slide member 96, and the tip of the projecting piece 102 projects toward the insertion opening 74 of the fitting receiving part 71. The slide member 96 is energized by the compression coil spring 98, and stopped at the side having the insertion opening 74 of the fitting receiving part 71.

As can be seen from FIG. 8, the mounting part 72 is provided with a board body 77 provided with a mounting circuit and the blocking part 78 which projects from the board body 77.

The blocking part 78 prevents a user from mistakenly inserting a member different from the power supply fitting pieces 25, 26 such as an SD card into the insertion opening 74 of the fitting receiving part 71 when the attachment side fitting part 56 is assembled.

The blocking part 78 of the present embodiment is a resistor which constitutes a part of the mounting circuit on the board body 77, for example, a chip resistor.

As illustrated in FIG. 2, the attachment side fixing parts 52, 53 are engaged with the fixing holes 45, 46 of the panel side fixing part 12 of the light-emitting panel 2 to hold the orientation of the light-emitting panel 2.

The attachment side fixing parts 52, 53 are capable of extension and contraction, and extend in a tapered form from the base end side (the side having the base part 50) toward the tip side. Specifically, the attachment side fixing part 52 is a coil spring whose diameter is reduced toward the tip side from the base end side (the side having the base part 50).

Here, a positional relationship between the parts that constitute the attachment device 3 will be described.

As illustrated in FIG. 2, the extensible part 58 and the attachment side fixing parts 52, 53 are distributed in a planar state, and fixed and suspended on the lower face of base part 50.

As illustrated in FIG. 9, the extensible part 58 is connected to a top face 61 of the connection part 59, and the shaft part 65 of the coupling part 60 is connected to the inclined surface 62 of the connection part 59. That is, the coupling part 60 is inclined with respect to the extensible part 58 and inclined at a predetermined angle $\alpha$ with respect to a plane parallel to the installation surface 4.

The angle $\alpha$ of the coupling part 60 is preferably 30° or more and 60° or less.

In the present embodiment, the angle $\alpha$ of the coupling part 60 in a suspended state is 45°.

Figure 11:
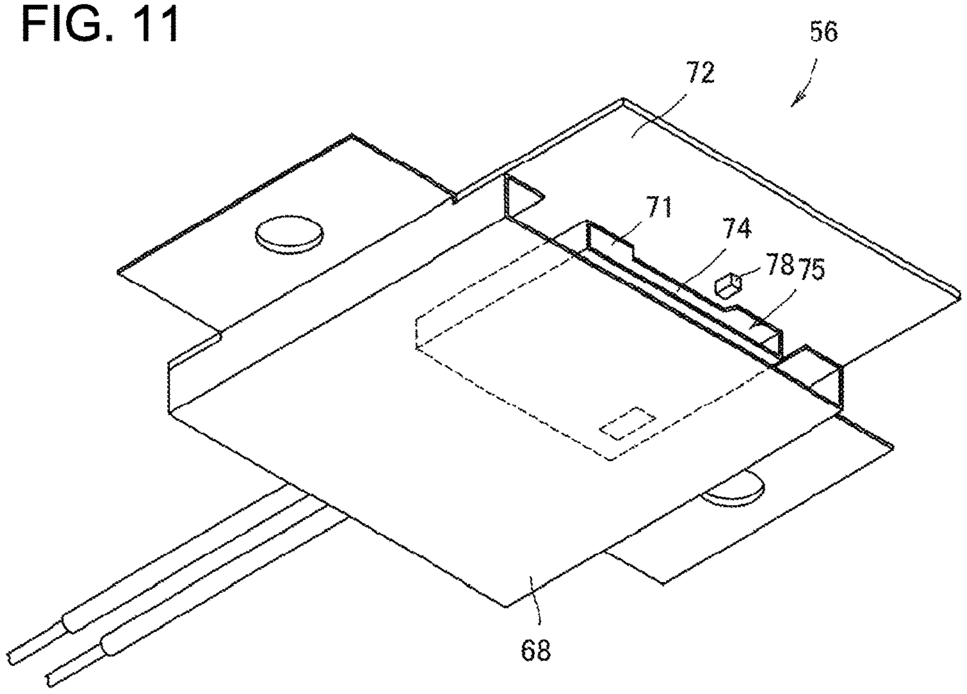
FIG. 11 is a perspective view of a principal part of the attachment side fitting part of FIG. 3 viewed from a different direction.

As illustrated in FIG. 11, the mounting part 72 is located above the fitting receiving part 71, and the blocking part 78 blocks a part of the insertion space 75 of the fitting receiving part 71.

As illustrated in FIG. 3, the ball part 66 is housed inside the housing space 73 of the ball receiving part 70. That is, the ball receiving part 70 and the ball part 66 constitute a universal joint, and are capable of freely changing an angle of joining the attachment side fitting part 56 to the coupling part 60.

The ball part 66 which serves as the turning center of the attachment side fitting part 56 is located on the inner side of the light-emitting panel 2 within a range of one-third of the length of the light-emitting panel 2 from the end thereof in plan view. The ball part 66 which serves as the turning center of the attachment side fitting part 56 is preferably located near the end of the light-emitting panel 2.

Next, positional relationships when the light-emitting panel 2 is detached from and attached to the attachment device 3 using the light emitting panel attachment structure 1 will be described.

First, a positional relationship when the light-emitting panel 2 is attached to the attachment device 3 will be described.

The panel side fitting part 11 is slid with respect to the attachment side fitting part 56 so as to be fitted thereto. That is, the light-emitting panel 2 is slid in a direction (fitting direction) parallel to the emission surface 8 of the light-emitting panel 2 so as to be attached to the attachment device 3 (fitting state).

Specifically, the power supply fitting pieces 25, 26 of the panel side fitting part 11 are inserted into the insertion space 75 of the fitting receiving part 71 of the attachment side fitting part 56 so that the side wall part 107 which forms the side face of the fitting receiving part 71 is interposed between the power supply fitting piece 26 and the signal fixing piece 27.

At this time, the panel side power supply terminals 32, 33 are slid against the attachment side power supply terminals 90, 91 (base conductive parts) for the attachment. That is, the panel side power supply terminals 32, 33 are moved to slide while making contact with the attachment side power supply terminals 90, 91 (base conductive parts) for the attachment. Thus, it is possible to allow the panel side power supply terminals 32, 33 to have sufficient contact with the attachment side power supply terminals 90, 91 (base conductive parts), which enables sufficient electrical conduction.

The signal conductive part 35 of the signal fixing piece 27 is electrically connected to a part of the mounting circuit of the mounting part 72.

Figure 12A:
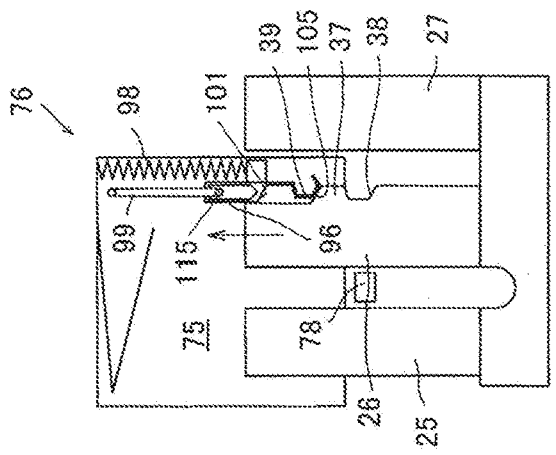
FIGS. 12A to 12C are plan views illustrating an internal structure of the fitting receiving part when the light-emitting panel of FIG. 2 is attached to the attachment device and illustrating steps of the attachment.
Figure 12B:
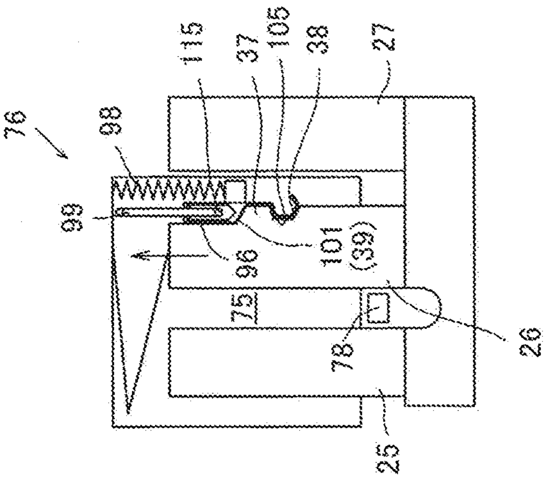
Figure 12C:
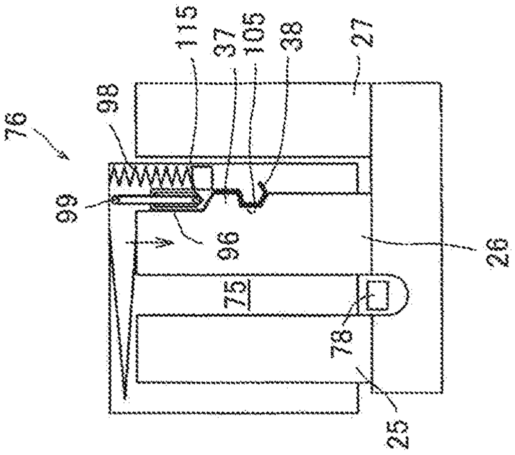

An operation at this time will be described by focusing on the inside of the fitting receiving part 71. As illustrated in FIG. 12A, when the power supply fitting pieces 25, 26 are inserted into the insertion space 75, the inclined surface 39 of the power supply fitting piece 26 abuts against the first bent part 105. When the power supply fitting pieces 25, 26 are further inserted, the first bent part 105 is elastically deformed in a direction away from the inclined surface 39 while sliding along the inclined surface 39. When the inclined surface 39 abuts against the engagement surface 101, the first bent part 105 is inserted into the fixing cut-away part 38 through the locking piece 37 of the power supply fitting piece 26 as illustrated in FIG. 12B.

Then, when the pressing of the power supply fitting pieces 25, 26 is stopped after the power supply fitting pieces 25, 26 are completely pushed, the drive part 115 of the guide rod 99 passes through the advance side path and is locked to the locking groove (not illustrated) in a slightly returned state. Further, the slide member 96 is energized by the compression coil spring 98, and the power supply fitting pieces 25, 26 are locked inside the insertion space 75.

At this time, the first bent part 105 located on the tip of the projecting piece 102 is locked with elasticity inside the fixing cut-away part 38, which prevents the power supply fitting pieces 25, 26 from coming off.

Next, a positional relationship when the light-emitting panel 2 is detached from the attachment device 3 will be described.

Figure 13C:
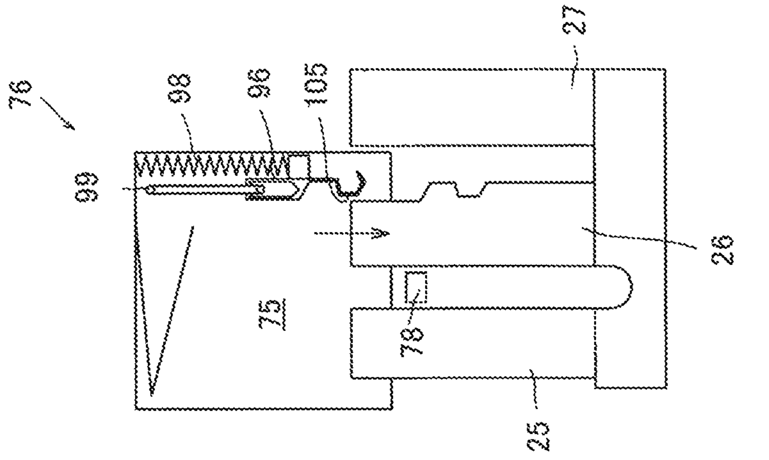
FIGS. 13A to 13C are plan views illustrating an internal structure of the fitting receiving part when the light-emitting panel of FIG. 2 is detached from the attachment device and illustrating steps of the detachment.
Figure 13B:
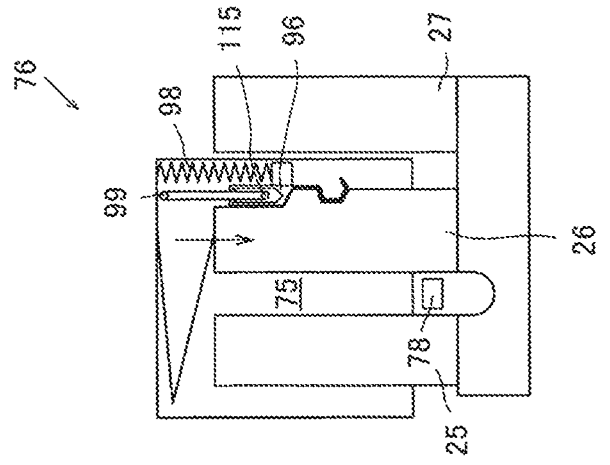
Figure 13A:
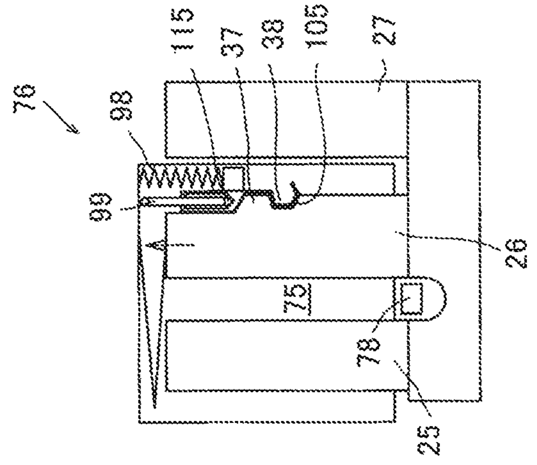

As illustrated in FIGS. 13A to 13C, the panel side fitting part 11 is slid in the fitting direction with respect to the attachment side fitting part 56 and then pulled out. That is, the panel side fitting part 11 is once slid in the fitting direction parallel to the emission surface 8, and then slid in a direction opposite to the fitting direction so as to be detached.

Specifically, the power supply fitting pieces 25, 26 of the panel side fitting part 11 are inserted in the insertion space 75 of the fitting receiving part 71 of the attachment side fitting part 56 and, in this inserted state, further slid in the inserting direction, and an external force is then applied to pull out the light-emitting panel 2 from the attachment device 3.

At this time, the panel side power supply terminals 32, 33 are slid against the panel side power supply parts 86, 87 for the detachment. That is, the panel side power supply terminals 32, 33 are moved while making contact with the panel side power supply parts 86, 87 for the detachment.

Further, at this time, the fitting state between the panel side fitting part 11 and the attachment side fitting part 56 is released, so that the light-emitting panel 2 is separated from the attachment device 3.

An operation at this time will be described by focusing on the inside of the fitting receiving part 71. As illustrated in FIG. 13A, when the power supply fitting pieces 25, 26 are again pressed, the drive part 115 of the guide rod 99 is released from the locking groove (not illustrated) and moved to the return side path. As illustrated in FIG. 13B, the slide member 96 is energized by the compression coil spring 98 to move the power supply fitting pieces 25, 26 toward the opening side of the insertion space 75.

When the drive part 115 of the guide rod 99 relatively returns to the starting point of the heart-shaped cam groove 100, the slide member 96 stops. Then, as illustrated in FIG. 13C, the power supply fitting pieces 25, 26 are detached from the insertion space 75 of the fitting receiving part 71 by pulling out the power supply fitting pieces 25, 26.

In this manner, the eject mechanism 76 of the fitting receiving part 71 enables the power supply fitting pieces 25, 26 to be locked by pushing the power supply fitting pieces 25, 26 into the insertion space 75, and to be ejected from the insertion space 75 by again pushing the power supply fitting pieces 25, 26 to release the lock.

Next, an operation when the orientation of the light-emitting panel 2 is changed to replace the light-emitting panel 2 will be described. First, for the convenience of description, a state in which the attachment device 3 is in a parallel orientation will be described.

Figure 14A:
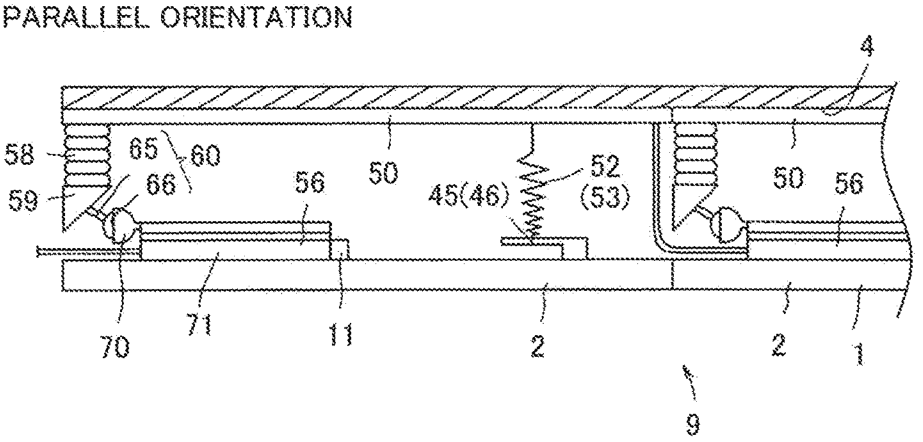

As illustrated in FIG. 1, the light-emitting panel attachment structure 1 and other light-emitting panel attachment structures 1 are distributed with planar extension on the installation surface 4 to form the light-emitting panel aligned-arrangement structure 9. The light-emitting panel 2 is densely surrounded by other light-emitting panels 2 to form a single plane. As illustrated in FIG. 14A, the panel side fitting part 11 of the light-emitting panel 2 and the attachment side fitting part 56 of the attachment device 3 are fitted with each other, and the light-emitting panel 2 is parallel to the installation surface 4.

In the attachment device 3 in the parallel orientation, an angle between the shaft part 65 and the fitting receiving part 71 is an obtuse angle. The extensible part 58 is in a contracted state, and the light-emitting panel 2 and the installation surface 4 are located closely to each other. The attachment side fixing parts 52, 53 are attached to the fixing holes 45, 46, and the attachment side fixing parts 52, 53 are in a state having a natural length or a length slightly longer than the natural length.

Then, the light-emitting panel 2 is turned to bring the attachment device 3 into an intersecting orientation.

Figure 14B:
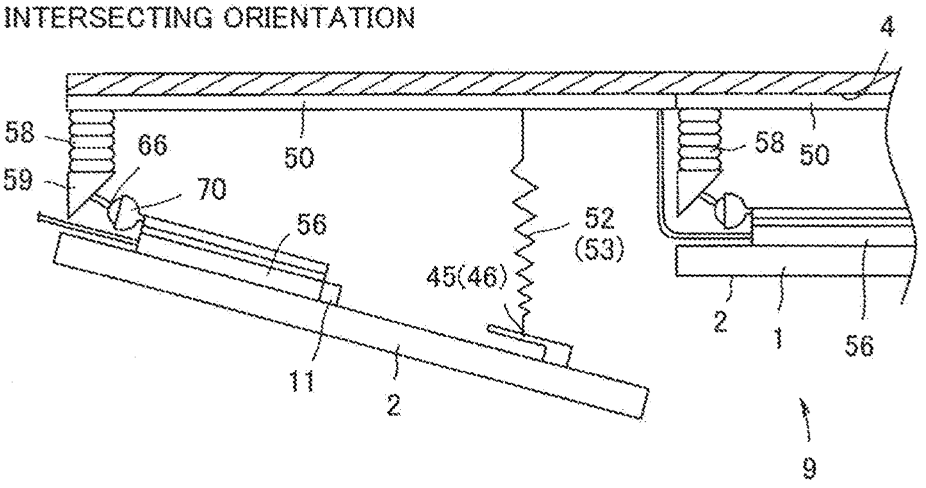

At this time, as illustrated in FIG. 14B, the attachment side fitting part 56 turns on a plane perpendicular to the installation surface 4 around the coupling part 60 which is located closer to the installation surface 4 than the attachment side fitting part 56 to bring the attachment device 3 into the intersecting orientation.

At this time, as illustrated in FIG. 14B, the light-emitting panel 2 is tilted in a direction that intersects the installation surface 4 so that the insertion opening 74 of the fitting receiving part 71 can be visually recognized through a gap between the light-emitting panel 2 and the installation surface 4.

Specifically, an angle $\beta$ between the base part 50 fixed to the installation surface 4 and a plane formed by extending the emission surface 8 of the light-emitting panel 2 is 15° or more and 90° or less.

With this angle range, the insertion opening 74 of the fitting receiving part 71 is widely open to enable easy insertion of the power supply fitting pieces 25, 26 during replacement.

Further, at this time, the attachment side fixing parts 52, 53 are in a more extending state than the state during the parallel orientation along with the tilting of the light-emitting panel 2, and a energizing force toward the installation surface 4 thus acts.

Thus, the light-emitting panel 2 does not fall even when the fitting state between the panel side fitting part 11 and the attachment side fitting part 56 is released.

When the light-emitting panel 2 is replaced with a new light-emitting panel 2, the currently-attached light-emitting panel 2 is detached, and the new light-emitting panel 2 is attached in this intersecting orientation.

That is, the panel side fitting part 11 is pulled out of the attachment side fitting part 56 to release the fitting state, and the attachment side fixing parts 52, 53 are detached from the fixing holes 45, 46 of the fixing pieces 42, 43 of the light-emitting panel 2, respectively. Then, the attachment side fixing parts 52, 53 are attached to the fixing holes 45, 46 of the fixing pieces 42, 43 of the new light-emitting panel 2, respectively, and the panel side fitting part 11 and the attachment side fitting part 56 are then fitted with each other to attach the new light-emitting panel 2 to the attachment device 3.

Then, as necessary, the light-emitting panel 2 is turned to bring the attachment device 3 into the parallel orientation.

At this time, the light-emitting panel 2 is energized toward the installation surface 4 by a restoring force of the attachment side fixing parts 52, 53. Thus, the attachment device 3 can be easily brought into the parallel orientation from the intersecting orientation.

In the change of the attachment device 3 from the parallel orientation to the intersecting orientation, when only a turning operation of the attachment side fitting part 56 with respect to the coupling part 60 is performed, the position of the attachment side fitting part 56 is substantially the same as the position in the parallel orientation in the up-down direction. Thus, during replacement of the light-emitting panel 2, the existence of the other light-emitting panels 2 may become a spatial obstacle.

Thus, in the light-emitting panel attachment structure 1 of the present embodiment, the attachment device 3 is provided with the extensible part 58 as described above. Thus, in the attachment device 3, the attachment side fitting part 56 is movable also in the up-down direction (the direction coming close to or away from the installation surface 4) in the intersecting orientation.

Figure 15A:
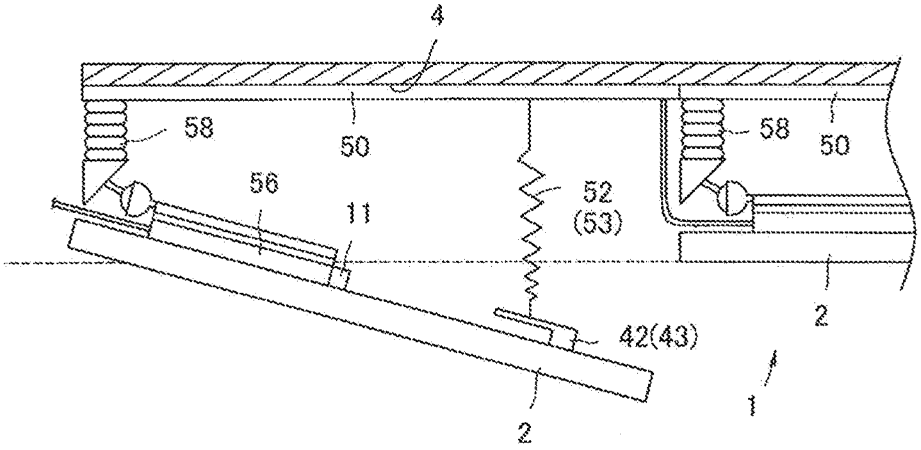

That is, as illustrated in FIG. 15A, the attachment device 3 in the intersecting orientation can take a basic orientation in which the extensible part 58 is in the same state as the state in the parallel orientation and an extending orientation in which the extensible part 58 is in an extending state. That is, the basic orientation is taken when orientation change of the light-emitting panel 2 is performed from the parallel orientation only by a turning operation, and the extensible part 58 is in a contracted state. That is, in the basic orientation, the position of the attachment side fitting part 56 is substantially the same as or slightly lower than the position during the parallel orientation in the up-down direction.

Figure 15B:
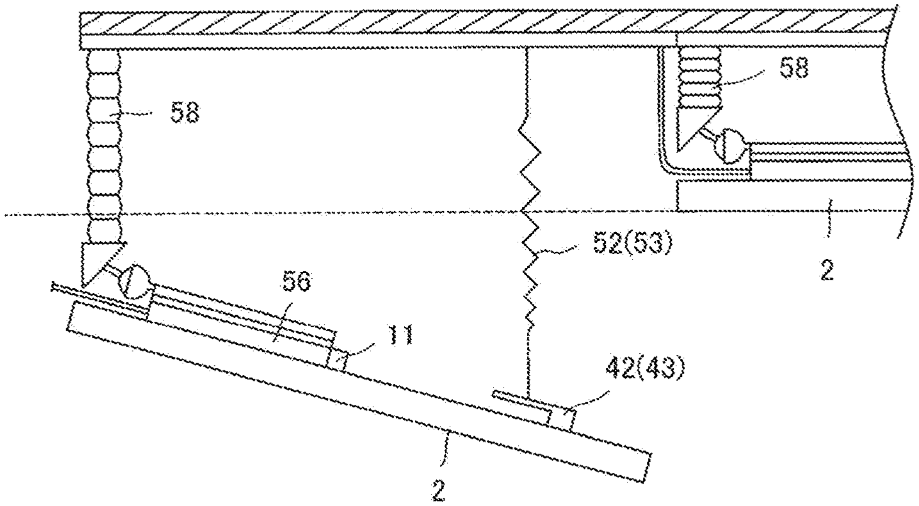

In the extending orientation, as illustrated in FIG. 15B, the extensible part 58 extends relative to the basic orientation, and the light-emitting panel 2 is located lower than the position during the basic orientation.

In other words, in the extending orientation, the position of the attachment side fitting part 56 is lower than the lower faces of the other light-emitting panels 2 in the parallel orientation. That is, the attachment side fitting part 56 is located at a position farther from the installation surface 4 in the vertical direction than the position of the attachment side fitting part 56 in the parallel orientation. Thus, when the panel side fitting part 11 is fitted with the attachment side fitting part 56, the fitting can be performed at a position farther from the installation surface 4 than the other light-emitting panels 2, and thus not obstructed by the other light-emitting panels 2. The attachment side fixing parts 52, 53 in the extending orientation are in a more extending state than the state during the parallel orientation, and a energizing force acts in the contracting direction. Thus, a return to the parallel orientation can be easily performed after the replacement.

In the above description, the change from the parallel orientation to the intersecting orientation and the change from the basic orientation to the extending orientation are independent. However, in practice, the center of gravity moves downward along with the turning operation during the change from the parallel orientation to the intersecting orientation, so that switch from the basic orientation to the extending orientation is performed.

That is, the own weight of the light-emitting panel 2 or an external force applied by a user extends the extensible part 58 and the attachment side fixing parts 52, 53 compared to their lengths during the basic orientation against the restoring force of the extensible part 58 and the attachment side fixing parts 52, 53. Thus, the panel side fitting part 11 is located lower than the lower faces of the other light-emitting panels in the parallel orientation.

As described above, since the fitting state between the panel side fitting part 11 and the attachment side fitting part 56 can be released at a position lower than the other light-emitting panels 2, the replacement can be performed with no spatial influence by the other light-emitting panels 2. Thus, it is not necessary to form a space for an operation for attaching the light-emitting panel 2 between the light-emitting panels 2, 2, and the light-emitting panels 2 can be arranged with substantially no gap therebetween on the installation surface 4.

In the light-emitting panel attachment structure 1 of the first embodiment, the power supply fitting pieces 25, 26 are inserted into the fitting receiving part 71, and the signal fixing piece 27 which is thicker than the power supply fitting pieces 25, 26 is attached to the side wall part 107 which forms the side face of the fitting receiving part 71. Thus, it is possible to reduce bending or wobble in the light-emitting panel 2 compared to a fitting state only between the power supply fitting pieces 25, 26 and the fitting receiving part 71.

In the light-emitting panel attachment structure 1 of the first embodiment, the two power supply fitting pieces 25, 26 which contribute to power supply are divided by the cutaway part 30. Thus, the panel side power supply terminals 32, 33 do not make contact with each other, and power supply can be performed independently on positive and negative sides. Thus, a short circuit caused by contact between the panel side power supply terminals 32, 33 can be prevented, which achieves high safety.

According to the light-emitting panel attachment structure 1 of the first embodiment, the power supply from the attachment device 3 to the light-emitting panel 2 can be performed using a fitting relationship between the panel side fitting part 11 and the attachment side fitting part 56. Thus, a light-emitting panel attachment structure that is simple and has high safety and high reliability for a user is achieved.

In the light-emitting panel attachment structure 1 of the first embodiment, the blocking part 78 is disposed to block a part of the insertion opening 74. Thus, it is possible to prevent a user from mistakenly inserting another member such as an SD card into the insertion opening 74.

In the light-emitting panel attachment structure 1 of the first embodiment, a tapered coil spring whose tip is narrowed is used as each of the attachment side fixing parts 52,

53, and the attachment side fixing parts 52, 53 are inserted into the fixing holes 45, 46 so as to be fixed, respectively. Thus, attachment and detachment can be easily performed, and it is possible to prevent unexpected fall of the light-emitting panel 2.

In the light-emitting panel attachment structure 1 of the first embodiment, the power supply fitting pieces 25, 26 are moved from the inner side (central side) toward the outer side (end side) in the plane direction of the light-emitting panel 2 to insert the power supply fitting pieces 25, 26 into the fitting receiving part 71. Thus, when the power supply fitting pieces 25, 26 are attached, a force is applied to the casing part 10. Since a reaction force of the casing part 10 at this time acts inward, the organic EL panel 6 is pressed by the frame member 5. Thus, an integration strength between the organic EL panel 6 and the frame member 5 is high, and the organic EL panel 6 is less prone to come off the frame member 5.

That is, when the power supply fitting pieces 25, 26 of the overhanging part 22 are inserted into and fixed to the fitting receiving part 71, the casing part 10 is brought into a suspended state through the standing wall part 21 and the extending part 20. That is, although the back face side cover part 17 of the casing part 10 is pulled in a direction away from the emission side cover part 15, a reaction force in a direction for moving the back face side cover part 17 close to the emission side cover part 15 acts on the casing part 10 to maintain its shape, and the organic EL panel 6 is pressed by the frame member 5. Thus, panel detachment/attachment having physically high strength and high reliability can be achieved.

In the light-emitting panel attachment structure 1 of the first embodiment, since the reinforcement member 7 is disposed on the back face of the organic EL panel 6, the reinforcement member 7 receives a load generated by bending caused when the power supply fitting pieces 25, 26 are attached to the fitting receiving part 71. Thus, the light-emitting panel attachment structure 1 of the first embodiment has high strength, and the organic EL panel 6 is less prone to be damaged.

In the light-emitting panel attachment structure 1 of the first embodiment, the orientation of the attachment device 3 can be changed between the parallel orientation and the intersecting orientation. Further, in both the parallel orientation and the intersecting orientation, the attachment device 3 can support the light-emitting panel 2. Accordingly, in the light-emitting panel attachment structure 1, for example, the light-emitting panel can be used as lighting in the intersecting orientation. That is, in the light-emitting panel attachment structure 1, the orientation of the light-emitting panel 2 can be changed according to layout, and high decorativeness is thus achieved.

In the light-emitting panel 2 of the present embodiment, the emission side cover part 15 is located at the side having the emission surface 8, and the outer edge of the emission side cover part 15 is smaller than the outer edge of the back face side cover part 17. Thus, it is possible to show the width of the frame member 5 as a narrow width to a user. Since the end face cover part 16 is inclined, it is possible to prevent the light-emitting panel 2 from making contact with the other light-emitting panels during the turning operation.

Next, a light-emitting panel attachment structure 150 of a second embodiment will be described. Elements similar to those of the first embodiment will be designated by the same reference signs, and description thereof will be omitted.

The light-emitting panel attachment structure 150 of the second embodiment has a structure different from the structure of the attachment device 3 of the first embodiment.

Figure 16:
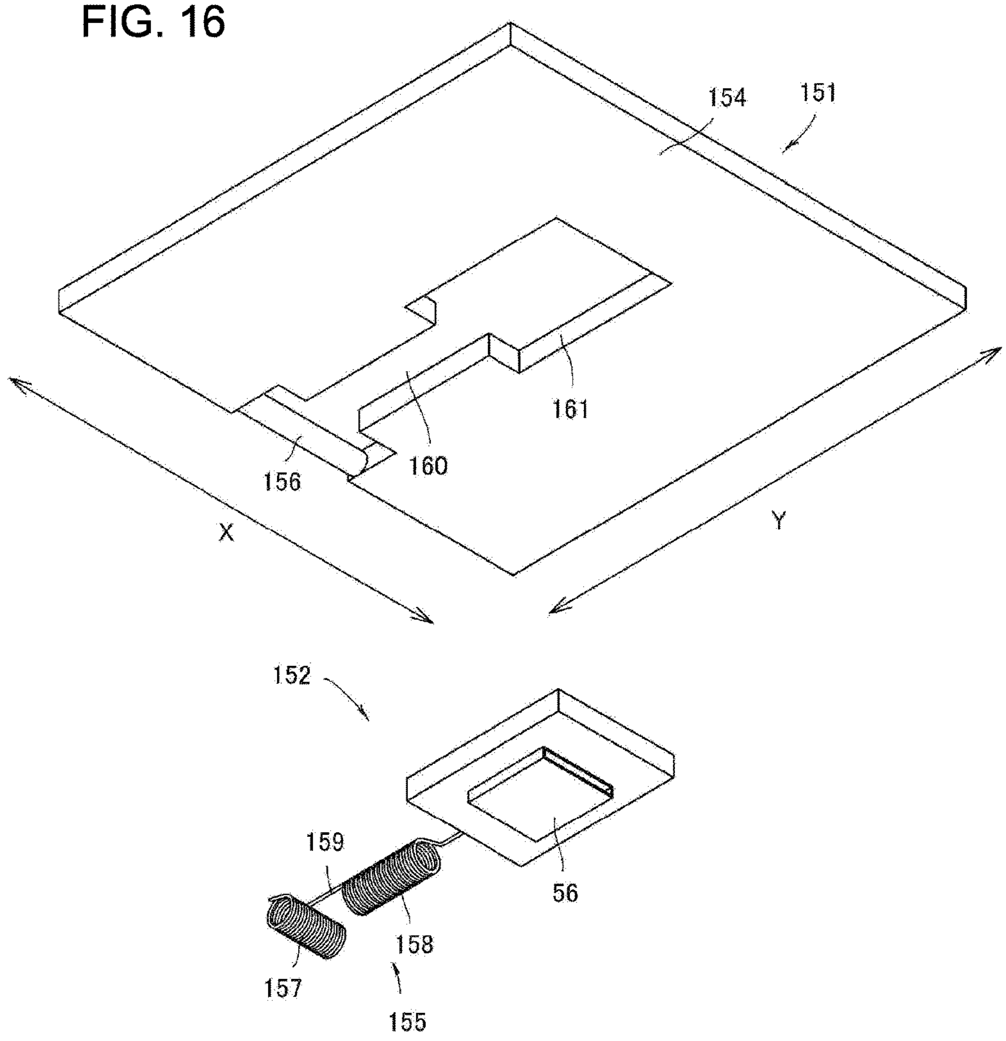
FIG. 16 is an exploded perspective view of a light-emitting panel attachment structure in a second embodiment of the present invention.

As illustrated in FIG. 16, an attachment device 151 of the second embodiment includes a base part 154 (fixing part) and an attachment part 152.

The attachment part 152 attaches the light-emitting panel 2 to the base part 154 and includes an orientation changing part 155 and an attachment side fitting part 56.

The base part 154 is fixed to the installation surface 4 such as a ceiling and serves as a base of the attachment device 151 similarly to the base part 50 of the first embodiment.

As illustrated in FIG. 16, the base part 154 includes a fixing shaft 156 which fixes a first helical part 157 of the orientation changing part 155, a first cut-away part 160 which can house the other part of the orientation changing part 155, and a second cut-away part 161 which can house the attachment side fitting part 56.

The fixing shaft 156 is a rod-like part that is inserted into the first helical part 157. The longitudinal direction of the fixing shaft 156 is aligned with the width direction X.

The first cut-away part 160 is a slit that linearly extends along the orientation changing part 155.

The second cut-away part 161 is a quadrangular hole that is continuous with the first cut-away part 160.

The orientation changing part 155 changes the orientation of the attachment device 151.

Figure 17:
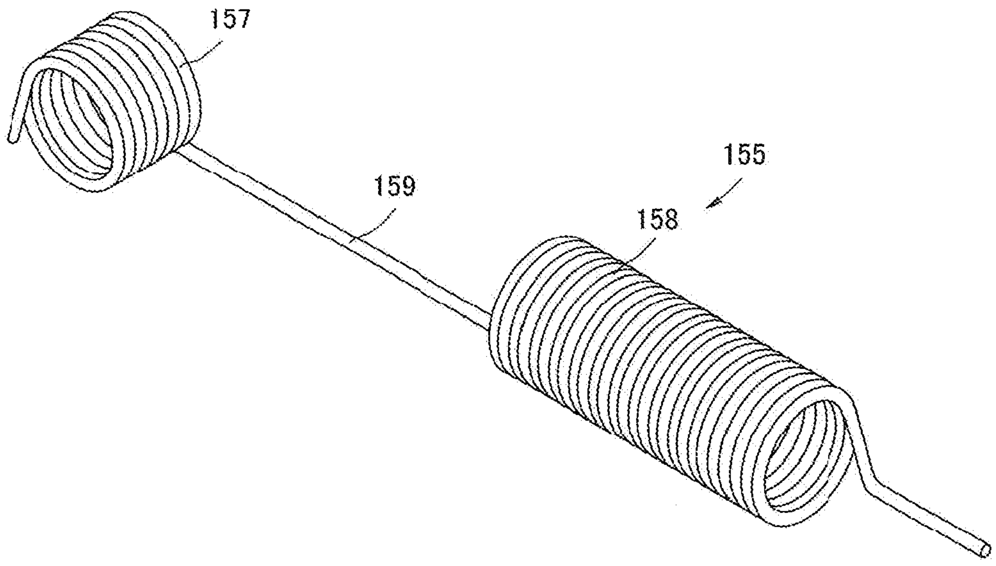
FIG. 17 is a perspective view illustrating an orientation changing part of FIG. 16.

The orientation changing part 155 is formed by applying bending to a single elastic linear body as illustrated in FIG. 17. The orientation changing part 155 includes the first helical part 157 which is wound in a coil shape in the width direction X, a second helical part 158 which is wound in a coil shape in a direction perpendicular to the width direction X, and a connection part 159 which connects the first helical part 157 and the second helical part 158.

The first helical part 157 is wound along the outer periphery of the fixing shaft 156.

The second helical part 158 is wound in a helical shape so as to be fitted inside the first cut-away part 160 and extensible.

Next, a positional relationship in each orientation of the light-emitting panel attachment structure 150 will be described.

The relationship between the light-emitting panel 2 and the attachment side fitting part 56 is similar to that in the first embodiment. Thus, a positional relationship in the orientation changing part 155 and the surroundings thereof will be focused.

First, a positional relationship in the attachment device 151 in a parallel orientation will be described.

The orientation changing part 155 is turnably supported around the fixing shaft 156 as a turning axis which is inserted into the first helical part 157.

The second helical part 158 and the connection part 159 are housed inside the first cut-away part 160 and parallel to the base part 154.

The attachment side fitting part 56 is housed inside the second cut-away part 161 and parallel to the base part 154.

That is, the first helical part 157, the second helical part 158, the connection part 159, and the attachment side fitting part 56 are arranged on the same plane.

The second helical part 158 is in a state having a natural length or a length longer than the natural length.

Figure 18A:
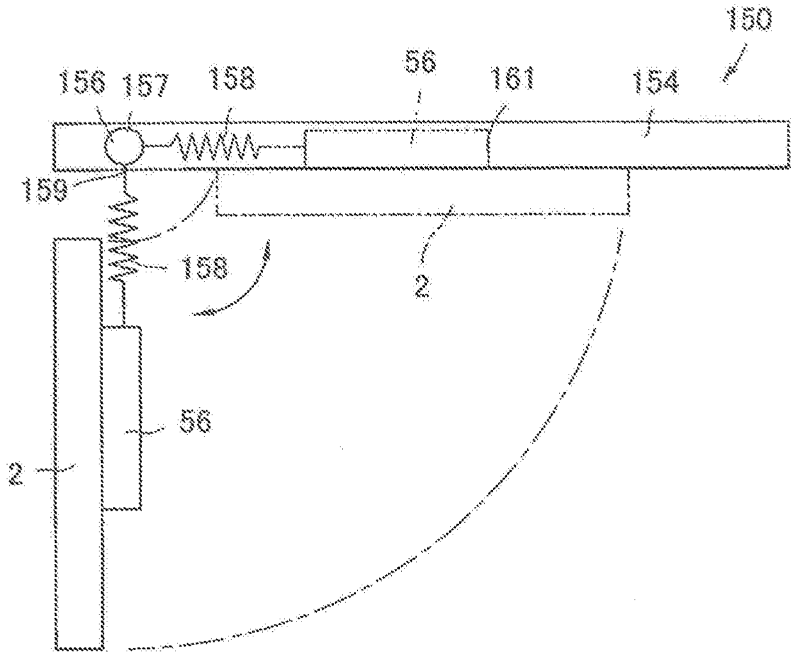

As illustrated in FIG. 18A, when change from the parallel orientation to the intersecting orientation is performed, the orientation changing part 155, the attachment side fitting part 56, and the light-emitting panel 2 turn around the fixing shaft 156 as the turning axis.

At this time, the attachment side fitting part 56 turns on a plane perpendicular to the installation surface 4 to change the orientation to the intersecting orientation.

Figure 18B:
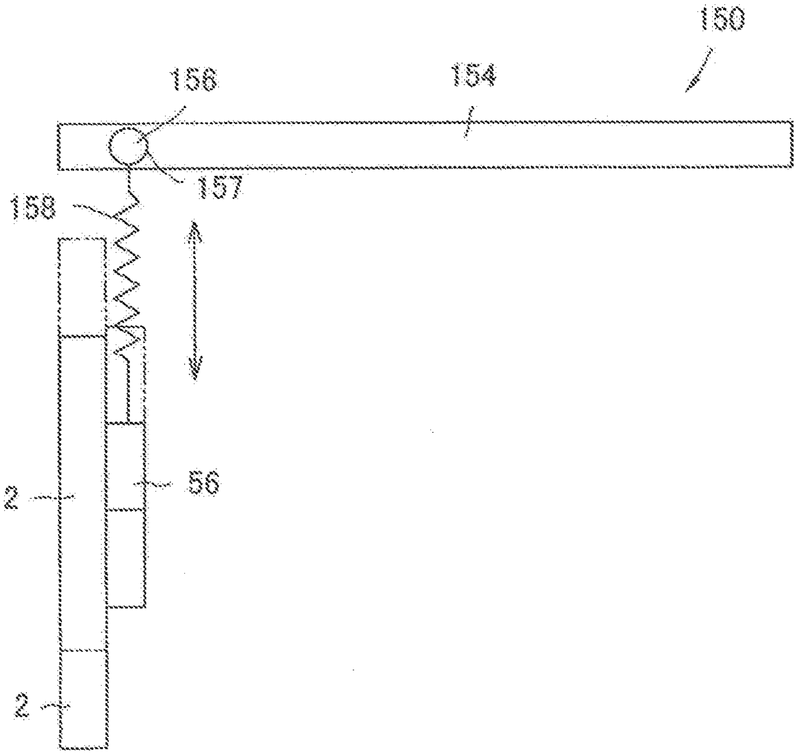

Also in the light-emitting panel attachment structure 150 of the second embodiment, in practice, the center of gravity moves downward along with the turning operation during the change from the parallel orientation to the intersecting orientation, so that switch from the basic orientation to the extending orientation is performed as illustrated in FIG. 18B.

That is, the own weight of the light-emitting panel or an external force applied by a user extends the second helical part 158 compared to the length during the basic orientation against the restoring force of the second helical part 158. Thus, the attachment side fitting part 56 is located lower than the lower faces of other light-emitting panels 2 in the parallel orientation.

According to the light-emitting panel attachment structure 150 of the second embodiment, since the orientation change between the parallel orientation and the intersecting orientation and the orientation change between the basic orientation and the extending orientation can be performed by the orientation changing part 155, the number of components can be reduced.

Next, a light-emitting panel attachment structure 200 of a third embodiment will be described. Elements similar to those of the first and second embodiments will be designated by the same reference signs, and description thereof will be omitted.

The light-emitting panel attachment structure 200 of the third embodiment differs from the first embodiment in the shape of a panel side fitting part and the shape of an attachment side fitting part.

Figure 19:
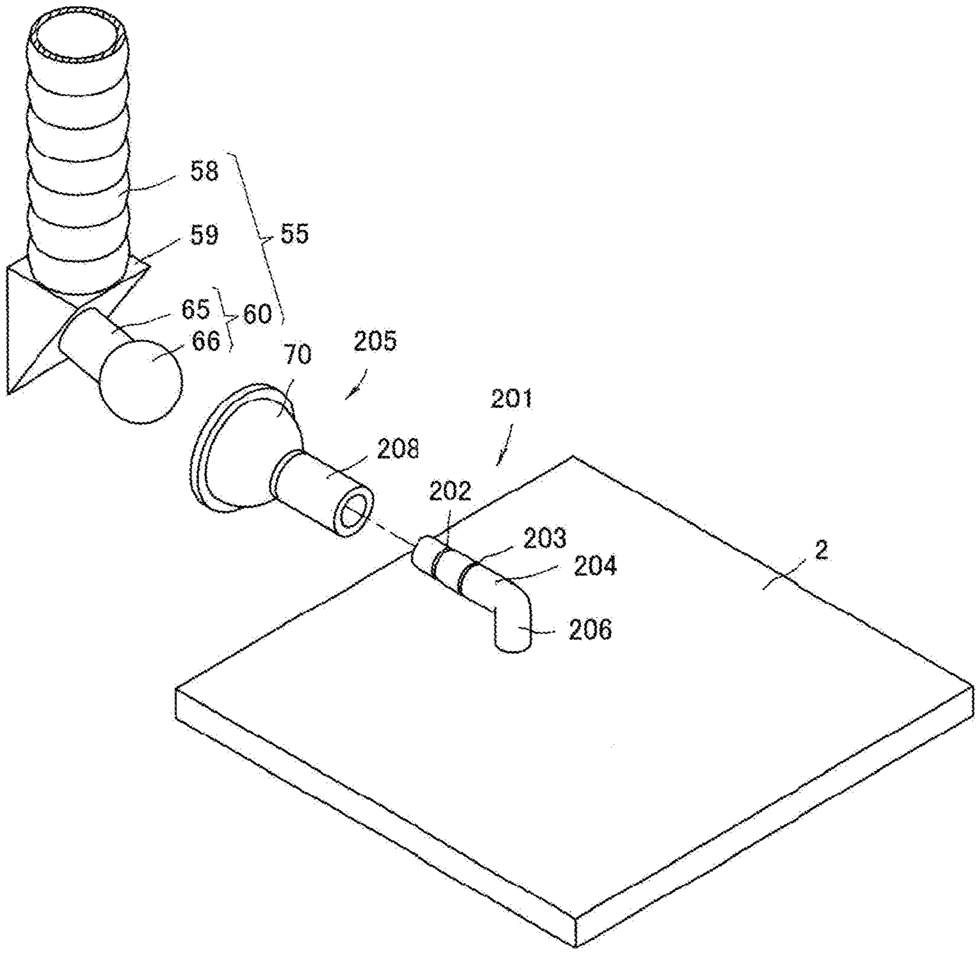
FIG. 19 is an exploded perspective view illustrating a light-emitting panel attachment structure of a third embodiment of the present invention.

As illustrated in FIG. 19, a panel side fitting part 201 of the third embodiment includes a standing wall part 206 which stands from a back face side of an organic EL panel 6 and a power supply fitting piece 204 which extends outward from the tip of the standing wall part 206.

The power supply fitting piece 204 is a cylindrical part and provided with panel side power supply terminals 202, 203 on the outer peripheral face thereof.

The panel side power supply terminals 202, 203 of the third embodiment are parts that are electrically connected to the panel side power supply parts 86, 87 of the light-emitting panel 2 when the light-emitting panel 2 is assembled similarly to the panel side power supply terminals 32, 33 of the first embodiment. The panel side power supply terminals 202, 203 are parts that serve as electrical contacts to attachment side power supply terminals 210, 211 when the light-emitting panel 2 is attached to the attachment device 3.

The attachment side fitting part 205 is fittable with the panel side fitting part 201.

The attachment side fitting part 205 includes a ball receiving part 70 and a fitting receiving part 208.

The fitting receiving part 208 is a cylindrical part inside which the power supply fitting piece 204 can be inserted and fitted.

Figure 20:
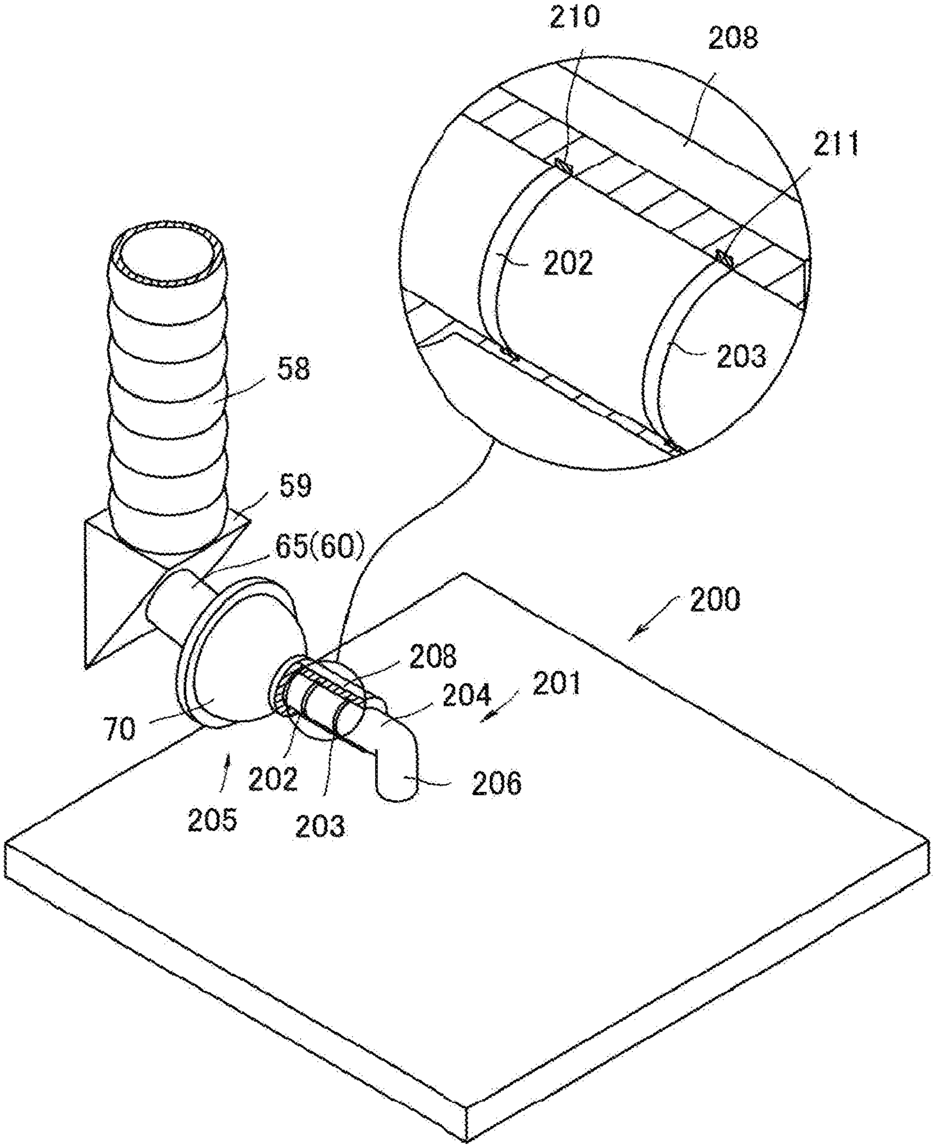
FIG. 20 is a partially cut-away perspective view of a principal part of the light-emitting panel attachment structure of the third embodiment of the present invention.

As illustrated in an enlarged view of FIG. 20, the fitting receiving part 208 includes the attachment side power supply terminals 210, 211 on the inner peripheral face thereof.

The attachment side power supply terminals 210, 211 are parts that are electrically connectable to an external power source similarly to the attachment side power supply terminals 90, 91 of the first embodiment and come into contact with the panel side power supply terminals 202, 203 of the panel side fitting part 201 when the light-emitting panel 2 is attached to the attachment device 3.

Next, a positional relationship in each orientation of the light-emitting panel attachment structure 200 will be described.

The positional relationship is the same as that in the first embodiment except the positional relationship with the panel side fitting part 201 and the attachment side fitting part 205. Thus, only the panel side fitting part 201 and the attachment side fitting part 205 will be briefly described.

First, a positional relationship in the attachment device in the parallel orientation will be described.

As illustrated in FIG. 20, the power supply fitting piece 204 is inserted and fitted inside the fitting receiving part 208, and the panel side power supply terminals 202, 203 are in contact with the attachment side power supply terminals 210, 211.

An axial direction of the power supply fitting piece 204 is parallel to the base part 50 and faces the same direction as an axial direction of the fitting receiving part 208.

When a change from a parallel orientation to an intersecting orientation is performed, the attachment side fitting part 205 turns on a plane perpendicular to the installation surface 4 to change the orientation to the intersecting orientation.

Also in the light-emitting panel attachment structure 200 of the third embodiment, in practice, the center of gravity moves downward along with the turning operation during the change from the parallel orientation to the intersecting orientation, so that switch from the basic orientation to the extending orientation is performed. That is, the attachment side fitting part 205 is located lower than the lower faces of other light-emitting panels in the parallel orientation.

Next, a light-emitting panel attachment structure 250 of a fourth embodiment will be described. Elements similar to those of the first to third embodiments will be designated by the same reference signs, and description thereof will be omitted.

The light-emitting panel attachment structure 250 of the fourth embodiment differs from the first embodiment in an attachment part.

Figure 21:
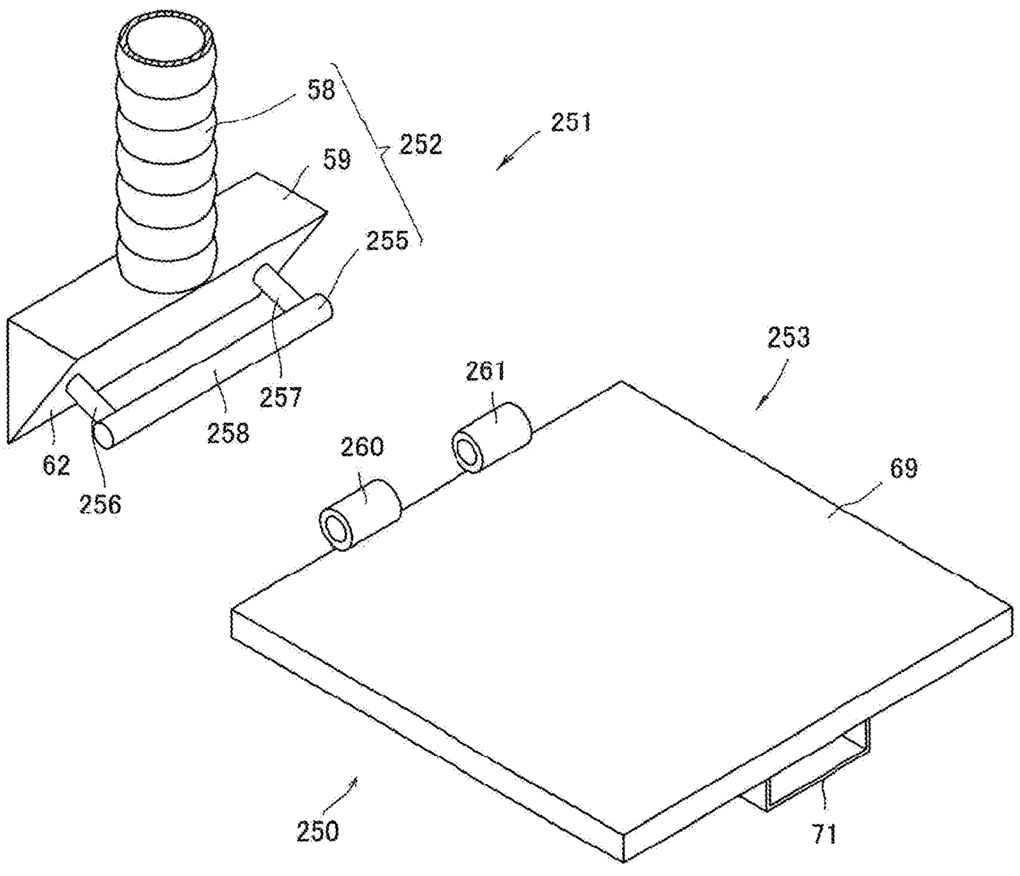
FIG. 21 is an exploded perspective view illustrating a light-emitting panel attachment structure of a fourth embodiment of the present invention.

As illustrated in FIG. 21, an attachment part 251 of the fourth embodiment attaches the light-emitting panel 2 to the base part 50 similarly to the attachment part 51 of the first embodiment and includes an orientation changing part 252 and an attachment side fitting part 253.

The orientation changing part 252 includes an extensible part 58 which is capable of extension and contraction, a connection part 59, and a coupling part 255.

The coupling part 255 includes shaft fixing parts 256, 257 which are disposed in a standing manner with respect to an inclined surface 62 of the connection part 59 and a shaft part 258 which is supported by the shaft fixing parts 256, 257.

The shaft part 258 is supported parallel to the inclined surface 62 of the connection part 59 with a predetermined space therebetween.

As illustrated in FIG. 21, the attachment side fitting part 253 includes shaft receiving parts 260, 261, a framework part 69, and a fitting receiving part 71.

The shaft receiving parts 260, 261 are tubular parts into which the shaft part 258 can be inserted, and the axes of the shaft receiving parts 260, 261 are located on the same straight line.

Next, a positional relationship in the light-emitting panel attachment structure 250 in each orientation will be described.

Configurations other than the attachment part 251 are the same as those of the first embodiment. Thus, the positional relationship in the attachment part 251 will be focused and briefly described.

First, a positional relationship in the attachment device in the parallel orientation will be described.

The shaft part 258 is inserted across both the shaft receiving parts 260, 261.

Figure 22A:
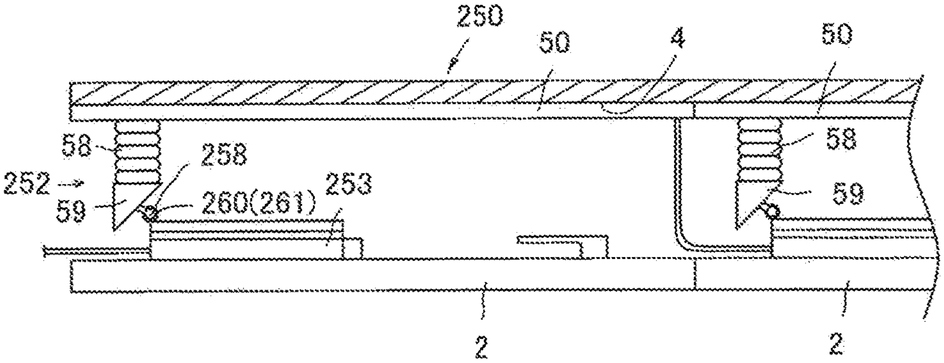

Thus, the shaft receiving parts 260, 261 are turnable in the circumferential direction around the shaft part 258 as a turning axis. That is, the light-emitting panel 2 is turnable on a plane that extends in a direction perpendicular to the installation surface 4 around the shaft part 258. As illustrated in FIG. 22A, the shaft receiving parts 260, 261 are parallel to the base part 50.

Figure 22B:
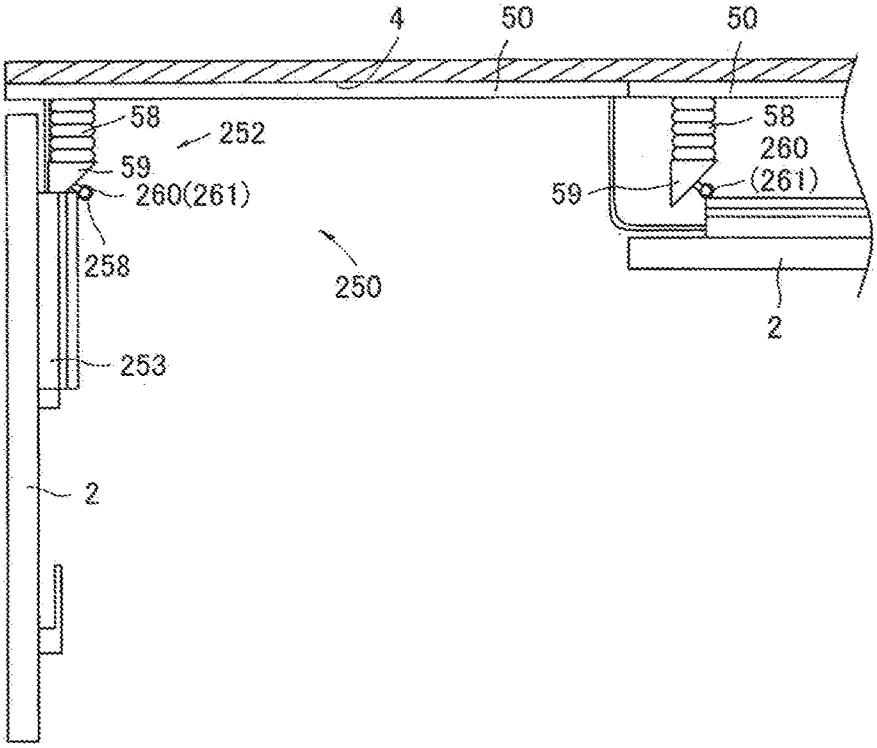

When a change from the parallel orientation to the intersecting orientation is performed, as illustrated in FIG. 22B, the attachment side fitting part 253 turns on the plane perpendicular to the installation surface 4, so that the orientation is changed to the intersecting orientation.

That is, the light-emitting panel 2 turns on the plane that extends in the direction perpendicular to the installation surface 4 around the shaft part 258 so as to be brought into an orientation intersecting the installation surface 4.

Although, in the first embodiment, the light-emitting panel 2 is supported also by the attachment side fixing parts 52, 53, the present invention is not limited thereto. The attachment side fixing parts 52, 53 may be removed (fifth embodiment).

Figure 23A:
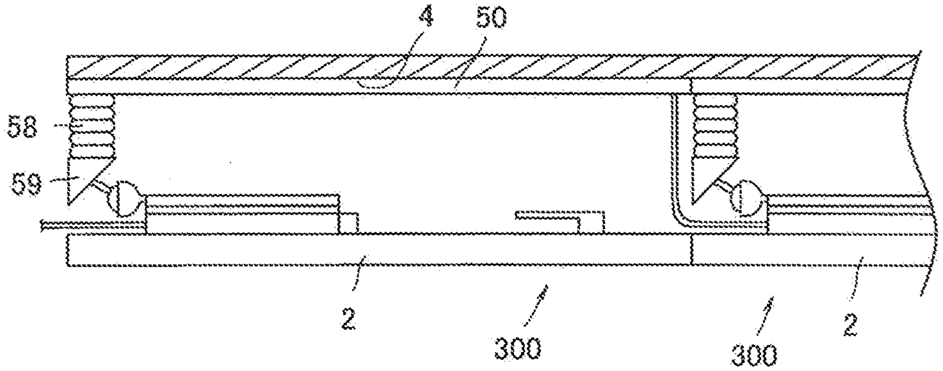
Figure 23B:
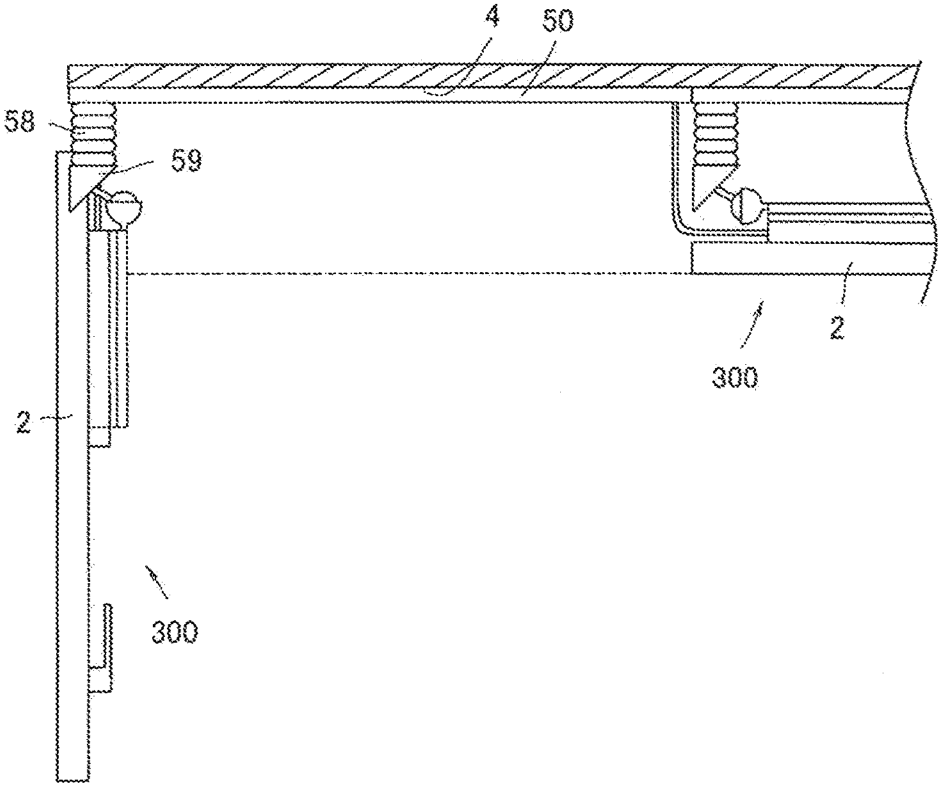

This case will be described. Alight-emitting panel attachment structure 300 of the fifth embodiment takes a parallel orientation and an intersecting orientation as illustrated in FIGS. 23A and 23B similarly to the light-emitting panel attachment structure 1 of the first embodiment.

The light-emitting panel attachment structure 300 of the fifth embodiment differs from the light-emitting panel attachment structure 1 of the first embodiment in that the attachment side fixing parts 52, 53 are not provided. Thus, in the intersecting orientation, the light-emitting panel 2 is not locked by the attachment side fixing parts 52, 53, and the light-emitting panel attachment structure 300 can take a vertical orientation in which the light-emitting panel 2 is vertical to the installation surface 4 as illustrated in FIG. 23B.

Figure 24A:
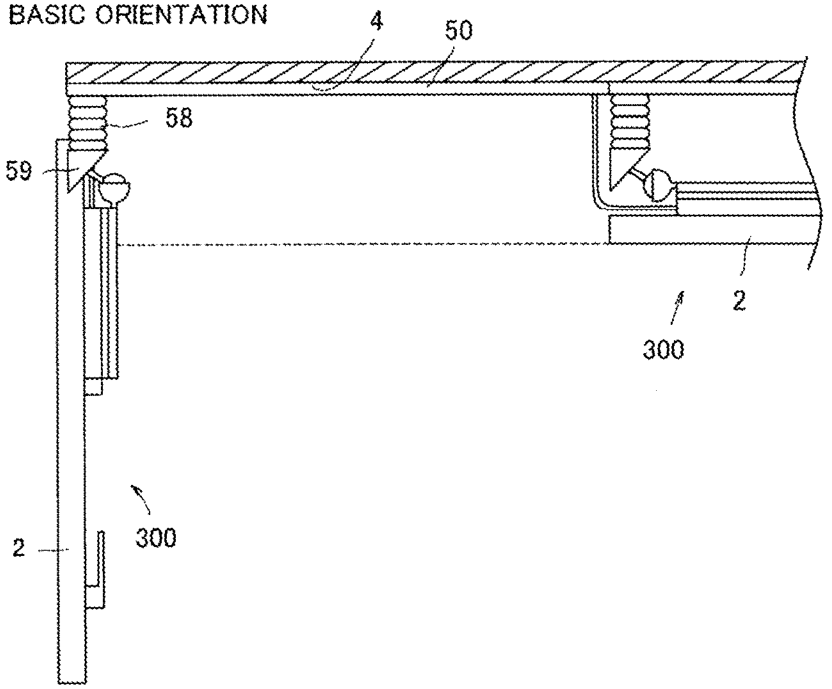
Figure 24B:
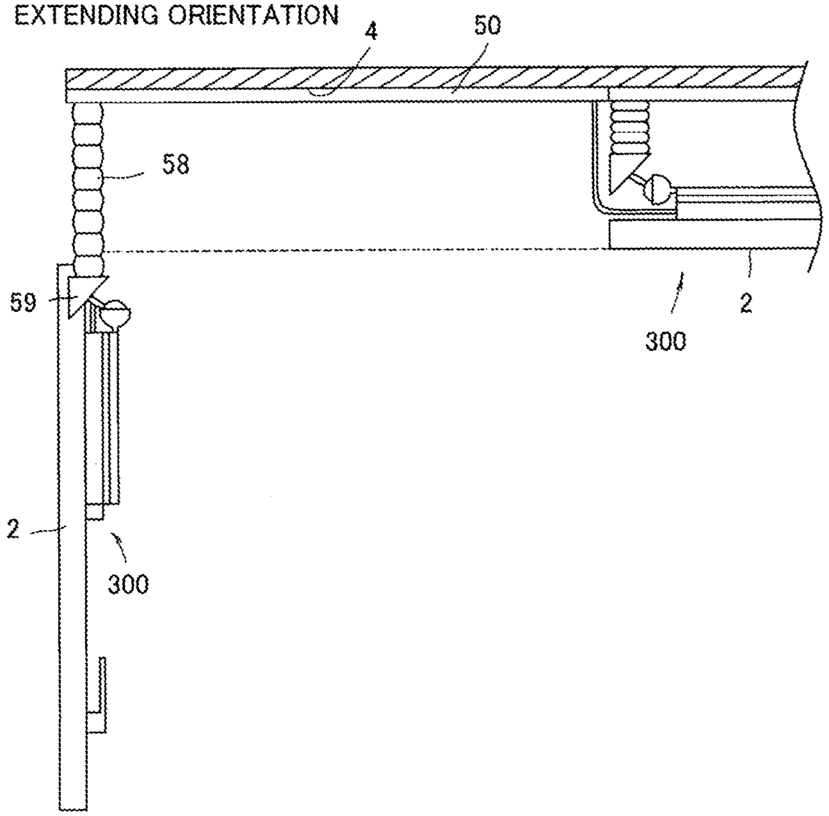

The light-emitting panel attachment structure 300 of the fifth embodiment is provided with an extensible part 58 similarly to the first embodiment. Thus, as illustrated in FIGS. 24A and 24B, the light-emitting panel attachment structure 300 can slidably move in the up-down direction by performing a change from the basic orientation (FIG. 24A) to the extending orientation (FIG. 24B) in the state of the vertical orientation. That is, in replacement of the light-emitting panel 2, the light-emitting panel 2 can be detached and attached in the vertical orientation.

It is needless to say that the same orientation change as the above embodiments can be performed also in an intersecting orientation other than the vertical orientation.

According to the light-emitting panel attachment structure 300 of the fifth embodiment, since vertical detachment/attachment of the light-emitting panel 2 can be performed, it is possible to replace the light-emitting panel 2 at a lower position.

Figure 25:
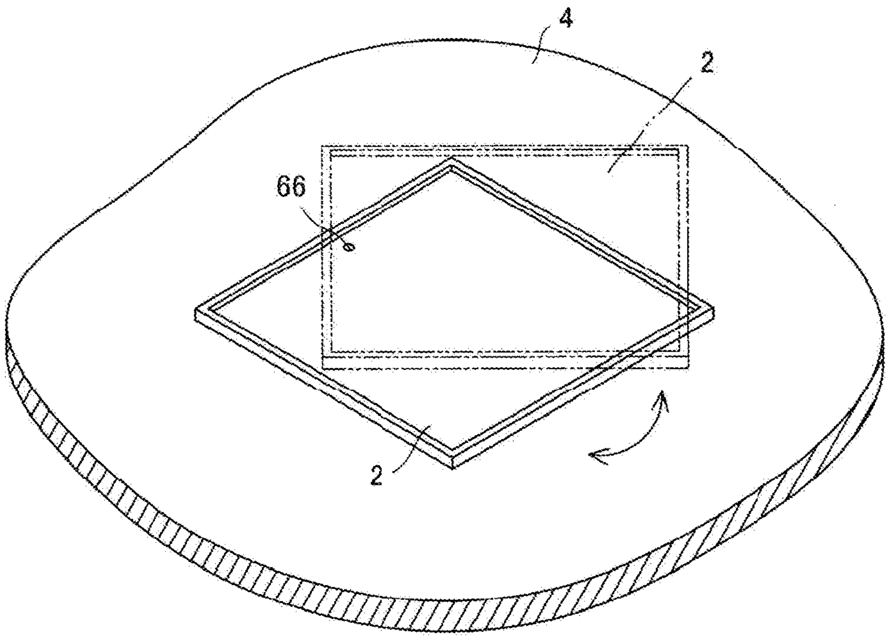
FIG. 25 is a schematic view illustrating a movement example of the light-emitting panel attachment structure of FIGS. 23A and 23B.

According to the light-emitting panel attachment structure 300 of the fifth embodiment, since the attachment side fixing parts 52, 53 are not provided, movement in the circumferential direction around the ball part 66 on a horizontal plane that passes through the ball part 66 can also be performed. That is, in the light-emitting panel attachment structure 300, the relationship between the ball part 66 of the coupling part 60 and the ball receiving part 70 of the attachment side fitting part 56 forms a universal joint. Thus, as illustrated in FIG. 25, a turn on a plane parallel to the installation surface 4 around the ball part 66 of the coupling part 60 can also be performed. Thus, layout in a living space can be changed by turning the light-emitting panel 2 in the plane direction.

Although, in the above embodiments, the extensible part 58 is located between the base part 50 and the connection part 59, the present invention is not limited thereto. The extensible part 58 may be interposed between the base part 50 and the connection part 59.

Although, in the above embodiments, a plurality of light-emitting panel attachment structures 1 are arranged side by side to form the light-emitting panel aligned-arrangement structure 9, the present invention is not limited thereto. The light-emitting panel attachment structure 1 may be independently used.

Although, in the above embodiments, a single attachment part is provided with respect to a single base part, the present invention is not limited thereto. A plurality of attachment parts may be provided with respect to a single base part. In this case, a plurality of light-emitting panels are attached to a single base part.

An example in this case will be briefly described. Light-emitting panels 2 are arranged with planar expansion, and a plurality of attachment side fitting parts are disposed corresponding to the light-emitting panels 2.

Ball parts 66 each of which serves as a turning center of the corresponding attachment side fitting part are arranged at an interval of a length in the fitting direction of the light-emitting panel.

Figure 26:
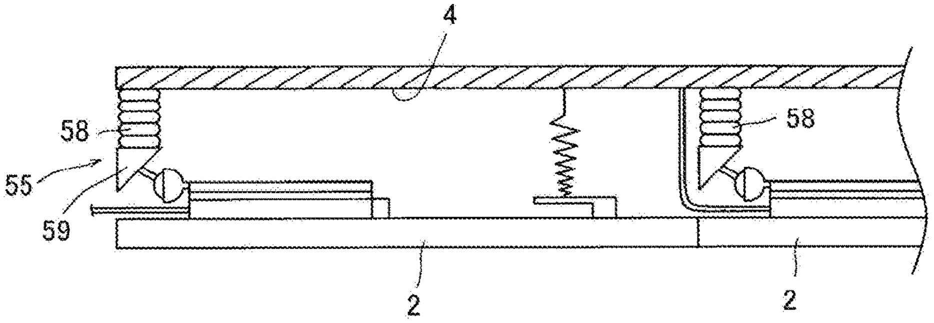
FIG. 26 is a sectional view illustrating another embodiment of the present invention.

Although, in the above embodiments, the extensible part 58 is connected to the installation surface 4 through the base part 50, the present invention is not limited thereto. As illustrated in FIG. 26, the extensible part 58 may be directly connected to the installation surface 4. Similarly to the above, the connection part 59 of the orientation changing part 55 may be directly connected to the installation surface 4.

Although, in the above embodiments, the extensible part 58 has a cylindrical cross-sectional shape, the present invention is not limited thereto. The outer shape of the extensible part 58 may be a polygonal shape.

Although, in the above embodiments, an accordion hose is used as the extensible part 58, the present invention is not limited thereto. The extensible part 58 is only required to have an extensible function. For example, the extensible part 58 may be an elastic body such as a rubber or a spring.

Although, in the above embodiments, coil springs are used as the attachment side fixing parts 52, 53, the present invention is not limited thereto. Any member that is capable of fixing the light-emitting panel 2 may be used. For example, magnets may be used as the attachment side fixing parts 52, 53. In this case, the reinforcement member 7 is preferably a ferromagnetic body and fixed by a magnetic force.

Although, in the above embodiments, the power supply fitting pieces 25, 26 are disposed on the light-emitting panel 2, and the power supply fitting pieces 25, 26 are inserted into the fitting receiving part 71 of the attachment device 3 to fit the light-emitting panel 2 to the attachment device 3, the present invention is not limited thereto. The power supply fitting pieces 25, 26 may be disposed on the attachment device 3, the fitting receiving part 71 may be disposed on the light-emitting panel 2, and the power supply fitting pieces 25, 26 may be inserted into the fitting receiving part 71 to fit the attachment device 3 to the light-emitting panel 2. That is, the fitting relationship between the light-emitting panel 2 and the attachment device 3 may be reversed.

Although, in the above embodiments, the reinforcement member 7 is disposed on the light-emitting panel 2, the present invention is not limited thereto. The reinforcement member 7 may be omitted from the configuration of the light-emitting panel 2.

Although, in the above embodiments, the organic EL panel 6 is incorporated as the panel body in the light-emitting panel 2, the present invention is not limited thereto. The panel body may be another light source. For example, an LED device may be incorporated as a panel body in the light-emitting panel 2.

Although, in the above embodiments, the casing part 10 of the frame member 5 is formed corresponding to the outer shape of the organic EL panel 6, and has a quadrangular annular shape in plan view and a substantially "U"-shaped cross section, the present invention is not limited thereto. The casing part 10 of the frame member 5 may have any shape. That is, the casing part 10 is only required to cover a part of the organic EL panel 6 and may not necessarily extend along each side of the organic EL panel 6.

The casing part 10 of the frame member 5 preferably covers at least a part of the peripheral part of the organic EL panel 6 as the back face side cover part 17 as performed in the first embodiment.

Although, in the above embodiments, the overhanging part 22 is provided with the two power supply fitting pieces 25, 26 and the signal fixing piece 27, the present invention is not limited thereto. Among the two power supply fitting pieces 25, 26 and the signal fixing piece 27, the overhanging part 22 may be provided with at least the fitting piece 25, the fitting piece 26, or the fixing piece 27.

Although, in the above embodiments, the power supply fitting piece 25, the power supply fitting piece 26, and the signal fixing piece 27 are arranged in this order from one side to the other side in the width direction X in the overhanging part 22, the arrangement order may not be this order. For example, the power supply fitting piece 25, the signal fixing piece 27, and the power supply fitting piece 26 may be arranged side by side in this order.

EXPLANATION OF REFERENCE SIGNS

1, 150, 200, 250, 300: light-emitting panel attachment structure
2: light-emitting panel
3, 151: attachment device
4: installation surface
5: frame member
6: organic EL panel (panel body)
8: emission surface
9: light-emitting panel aligned-arrangement structure
10: casing part
11, 201: panel side fitting part
17: back face side cover part
20: extending part
21: standing wall part
22: overhanging part
25, 26: power supply fitting piece (engagement piece)
27: signal fixing piece (engagement piece)
32, 33, 202, 203: panel side power supply terminal
50: base part (fixing part)
56, 205, 253: attachment side fitting part
58: extensible part
60, 255: coupling part
66: ball part
70: ball receiving part
80: organic EL element (light-emitting element)
82: first electrode layer
83: organic light-emitting layer
85: second electrode layer
90, 91, 210, 211: attachment side power supply terminal
158: second helical part (extensible part)

The invention claimed is:

1. A light-emitting panel attachment structure comprising:
a light-emitting panel having an emission surface on one principal surface; and
an attachment device capable of attaching the light-emitting panel to an installation surface,
the light-emitting panel including a panel side fitting part on the other principal surface,
the attachment device including:
an attachment side fitting part fittable with the panel side fitting part; and
a coupling part located closer to the installation surface side than the attachment side fitting part,
wherein the attachment side fitting part is turnably attached to the coupling part,
wherein an orientation of the attachment device is changeable at least between a parallel orientation in which the attached light-emitting panel is parallel to the installation surface and an intersecting orientation in which the light-emitting panel faces a direction intersecting the installation surface along with a turn, and
wherein when the light-emitting panel is attached to the attachment device, the attachment device is changed to or maintained in the intersecting orientation, and either the light-emitting panel or the attachment device is slid parallelly to the emission surface to fit the panel side fitting part and the attachment side fitting part with each other.

2. The light-emitting panel attachment structure according to claim 1, wherein the attachment device is capable of supporting the light-emitting panel in both of the parallel orientation and the intersecting orientation.

3. The light-emitting panel attachment structure according to claim 1, wherein a turning center of the attachment side fitting part is located near an end of the light-emitting panel in the parallel orientation in plan view of the light-emitting panel.

4. The light-emitting panel attachment structure according to claim 1, wherein the attachment side fitting part is electrically connected to an external power source, and
wherein fitting between the panel side fitting part and the attachment side fitting part enables power supply to the light-emitting panel.

5. The light-emitting panel attachment structure according to claim 4,
wherein the light-emitting panel comprises a light-emitting element,
wherein the attachment side fitting part comprises an attachment side power supply terminal electrically connected to the external power source,
wherein the panel side fitting part comprises a panel side power supply terminal for supplying power to the light-emitting element, and
wherein when the light-emitting panel is attached to the attachment device, the attachment side power supply terminal and the panel side power supply terminal are relatively slid so as to make contact with each other.

6. The light-emitting panel attachment structure according to claim 1, wherein the attachment side fitting part is connected to the coupling part through a universal joint.

7. The light-emitting panel attachment structure according to claim 1, wherein the attachment device is capable of arranging the attachment side fitting part at a position farther from the installation surface in a vertical direction when configured in the intersecting orientation than when configured in the parallel orientation.

8. The light-emitting panel attachment structure according to claim 7, wherein the attachment device comprises a fixing part fixed to the installation surface and an extensible part capable of extension and contraction, the extensible part being interposed between the fixing part and the attachment side fitting part, and wherein the attachment device is extensible so that the attachment side fitting part is located at a position farther from the installation surface in the vertical direction when configured in the intersecting orientation than when configured in the parallel orientation.

9. The light-emitting panel attachment structure according to claim 1, comprising a plurality of the light-emitting panels arranged with planar expansion, wherein the attachment device comprises a plurality of the attachment side fitting parts that are arranged corresponding to the light-emitting panels, and wherein turning centers of the attachment side fitting parts are arranged side by side at an interval of a length in a fitting direction of the light-emitting panel.

10. A light-emitting panel aligned-arrangement structure comprising a plurality of the light-emitting panel attachment structures according to claim 1, wherein the light-emitting panel attachment structures are arranged with planar expansion, and wherein turning centers of the attachment side fitting parts are arranged side by side at an interval of a length in a fitting direction of the light-emitting panel.

11. A light-emitting panel attachable to an attachment device having an attachment side fitting part, the light-emitting panel comprising:

a panel body having an emission surface on one principal surface; and a frame member including:

a back face side cover part covering at least a part of a peripheral part of the other principal surface of the panel body; and a panel side fitting part on a face opposite to the panel body, the panel side fitting part including:

an extending part that extends from the back face side cover part toward a center of the panel body in plan view, a standing wall part that stands from an extending direction end of the extending part, and an overhanging part that overhangs from a tip of the standing wall part in an overhanging direction parallel to the extending direction of the extending part, wherein the panel side fitting part is slid in the overhanging direction of the overhanging part to fit the panel side fitting part to the attachment side fitting part to form a fitting state when the light-emitting panel is attached to the attachment device, and wherein the panel side fitting part is once slid in the overhanging direction and then slid in a direction opposite to the overhanging direction to release the fitting state when the light-emitting panel is detached from the attachment device.

12. The light-emitting panel according to claim 11, wherein the overhanging direction of the overhanging part is opposite to the extending direction of the extending part.

13. The light-emitting panel according to claim 12, wherein the panel body comprises an organic EL panel having the emission surface, wherein the frame member comprises a casing part that has the back face side cover part and that reaches one end side of the panel body in plan view of the panel body, and wherein the light-emitting panel comprises a reinforcement member, the reinforcement member being in contact with the casing part and the extending direction end of the extending part, the reinforcement member being in contact with the panel body.

14. The light-emitting panel according to claim 12, the light-emitting panel being attachable to the attachment device having an attachment side power supply terminal electrically connected to an external power source, wherein the panel body comprises an organic EL panel having the emission surface, the organic EL panel comprising an organic EL element of a laminated structure where an organic light-emitting layer is interposed at least between a first electrode layer and a second electrode layer, wherein the panel side fitting part comprises a panel side power supply terminal for supplying power to the organic EL element, and wherein when the light-emitting panel is attached to the attachment device, the panel side fitting part is slid in the overhanging direction to slide the panel side power supply terminal relative to the attachment side power supply terminal so as to come into contact with and to be electrically connected to each other.

15. The light-emitting panel according to claim 12, wherein the overhanging part comprises at least one engagement piece, a part of an edge of the engagement piece comprising in plan view:

a straight line segment linearly extending from an overhanging direction tip of the overhanging part toward the standing wall part; and an uneven segment extending from the overhanging direction tip of the overhanging part toward the standing wall part through a recess and projection.

* * * * *